(12) United States Patent
O et al.

(10) Patent No.: US 11,094,371 B2
(45) Date of Patent: Aug. 17, 2021

(54) MEMORY DEVICE FOR PROCESSING OPERATION AND METHOD OF OPERATING THE SAME

(71) Applicant: SAMSUNG ELECTRONICS CO., LTD., Suwon-si (KR)

(72) Inventors: Seongil O, Suwon-si (KR); Shinhaeng Kang, Suwon-si (KR); Namsung Kim, Yongin-si (KR); Kyomin Sohn, Yongin-si (KR); Sukhan Lee, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/810,344

(22) Filed: Mar. 5, 2020

(65) Prior Publication Data

US 2020/0294575 A1 Sep. 17, 2020

Related U.S. Application Data

(60) Provisional application No. 62/816,509, filed on Mar. 11, 2019.

(30) Foreign Application Priority Data

Nov. 22, 2019 (KR) .......................... 10-2019-0151617

(51) Int. Cl.
*G11C 11/409* (2006.01)
*G11C 11/4096* (2006.01)
(Continued)

(52) U.S. Cl.
CPC ...... *G11C 11/4096* (2013.01); *G06F 13/1668* (2013.01); *G06N 3/04* (2013.01); *G06N 3/063* (2013.01)

(58) Field of Classification Search
CPC ..... G11C 7/1045; G11C 7/1039; G11C 5/025; G11C 11/4087; G11C 11/409; G11C 8/12; G11C 5/063; G11C 7/109; G11C 7/1006
See application file for complete search history.

(56) References Cited

U.S. PATENT DOCUMENTS 7,363,555 B2   4/2008   Lee
7,792,892 B2   9/2010   Uehara
(Continued)

FOREIGN PATENT DOCUMENTS

JP   2006-293538   10/2006

OTHER PUBLICATIONS

Office Action issued in corresponding U.S. Appl. No. 16/814,462 dated Feb. 12, 2021.

*Primary Examiner* — Ajay Ojha
(74) *Attorney, Agent, or Firm* — F. Chau & Associates, LLC

(57) ABSTRACT

A memory device includes a memory bank including at least one bank group, a processor in memory (PIM) circuit including a first processing element arranged to correspond to the bank group, which processes operations by using at least one of data provided by a host and data read from the bank group, a processing element input and output (PEIO) gating circuit configured to control electric connection between a bank local IO arranged to correspond to each bank of the bank group and a bank group IO arranged to correspond to the bank group, and a control logic configured to perform a control operation so that a memory operation for the memory bank is performed or operations are processed by the PIM circuit. When the operations are processed by the first processing element, the PEIO gating circuit blocks the electric connection between the bank local IO and the bank group IO.

17 Claims, 20 Drawing Sheets

(51) Int. Cl.
    *G06N 3/063*     (2006.01)
    *G06N 3/04*     (2006.01)
    *G06F 13/16*     (2006.01)

(56) References Cited

U.S. PATENT DOCUMENTS

| | | |
|---|---|---|
| 9,971,541 B2 | 6/2018 | Lea et al. |
| 10,049,721 B1 | 8/2018 | Lea et al. |
| 10,061,590 B2 | 8/2018 | Wheeler et al. |
| 10,185,674 B2 | 1/2019 | Lea |
| 2010/0312998 A1 | 12/2010 | Walker |
| 2011/0231827 A1 | 9/2011 | Kilbane |
| 2012/0005434 A1 | 1/2012 | Kim |
| 2012/0215991 A1 | 8/2012 | Moyer |
| 2013/0036314 A1 | 2/2013 | Glew et al. |
| 2013/0169642 A1 | 7/2013 | Frascati et al. |
| 2014/0281149 A1 | 9/2014 | Roberts et al. |
| 2015/0046860 A1 | 2/2015 | Kim |
| 2017/0177498 A1 | 6/2017 | Wilkes |
| 2017/0344301 A1* | 11/2017 | Ryu .................... G06F 15/785 |
| 2017/0344480 A1 | 11/2017 | Beard et al. |
| 2018/0032458 A1 | 2/2018 | Bell |
| 2018/0239712 A1 | 8/2018 | Lea |
| 2019/0096453 A1 | 3/2019 | Shin et al. |
| 2019/0138893 A1 | 5/2019 | Sharma et al. |
| 2019/0198082 A1* | 6/2019 | O .......................... G06F 21/602 |
| 2019/0258487 A1* | 8/2019 | Shin .................... G06F 9/30029 |
| 2020/0020393 A1 | 1/2020 | Al-Shamma |

\* cited by examiner

MEMORY DEVICE FOR PROCESSING
OPERATION AND METHOD OF OPERATING
THE SAME

CROSS-REFERENCE TO RELATED
APPLICATION

This application claims priority under 35 U.S.C. § 119 to U.S. Provisional Application No. 62/816,509, filed on Mar. 11, 2019 in the U.S. Patent Office, and Korean Patent Application No. 10-2019-0151617, filed on Nov. 22, 2019 in the Korean Intellectual Property Office, the disclosures of which are incorporated by reference herein in their entireties.

TECHNICAL FIELD

Exemplary embodiments of the inventive concept relate to a memory device, and more particularly, to a memory device for processing an operation and a method of operating the same.

DISCUSSION OF RELATED ART

Capacity and speed of semiconductor memory devices used for high performance electronic systems are increasing. As an example of a memory device, dynamic random access memory (DRAM), which is a type of volatile memory, determines data by charges stored in a capacitor.

A memory device including DRAM may be used for various purposes, for example, for storing data used for processing various kinds of operations such as a neural network operation or an operation processing result.

SUMMARY

According to an exemplary embodiment of the inventive concept, a memory device includes a memory bank including a bank group including a plurality of banks, a processor in memory (PIM) circuit including a first processing element arranged to correspond to the bank group, where the first processing element processes operations by using at least one of data provided by a host and data read from the bank group, a processing element input and output (PEIO) gating circuit configured to control electric connection between a bank local input and output line (bank local IO) arranged to correspond to each of the plurality of banks of the bank group and a bank group input and output line (bank group IO) arranged to correspond to the bank group, and a control logic configured to perform a control operation so that a memory operation for the memory bank is performed or operations are processed by the PIM circuit based on a decoding result for a command/address received from the host. When the operations are processed by the first processing element, the PEIO gating circuit blocks the electric connection between the bank local IO and the bank group IO.

According to an exemplary embodiment of the inventive concept, a memory device includes a memory bank including a bank group including first and second banks, a bank group input and output line (bank group IO) arranged to correspond to the bank group and including a data transmitting path between an external host and the bank group, a first bank local input and output line (bank local IO) arranged to correspond to the first bank and including a transmitting path of data provided to the first bank and data read from the first bank, a first processing element connected to the bank group IO and the first bank local IO and configured to process operations by using at least one of data provided from the host and the data read from the first bank, and a first processing element input and output (PEIO) gating circuit configured to control a data transmitting path so that the data provided from the host is provided to the first processing element without being provided to the memory bank when operations are processed by the first processing element.

According to an exemplary embodiment of the inventive concept, for a method of operating a memory device including a bank group including a plurality of banks, the method includes determining an operation processing mode of the memory device based on a decoding result of a command/address from a host, blocking electric connection between a bank local input and output line (bank local IO) corresponding to a selected bank among the plurality of banks and a bank group input and output line (bank group IO) arranged to correspond to the bank group when the operation processing mode is determined, providing at least one of data provided by the host and data read from the selected bank to a processing element in a state in which electric connection between the bank local IO and the bank group IO is blocked, and processing operations by the processing element.

BRIEF DESCRIPTION OF THE DRAWINGS

The above and other features of the inventive concept will be more clearly understood by describing in detail exemplary embodiments thereof with reference to the accompanying drawings.

DETAILED DESCRIPTION OF THE EMBODIMENTS

Figure 1:
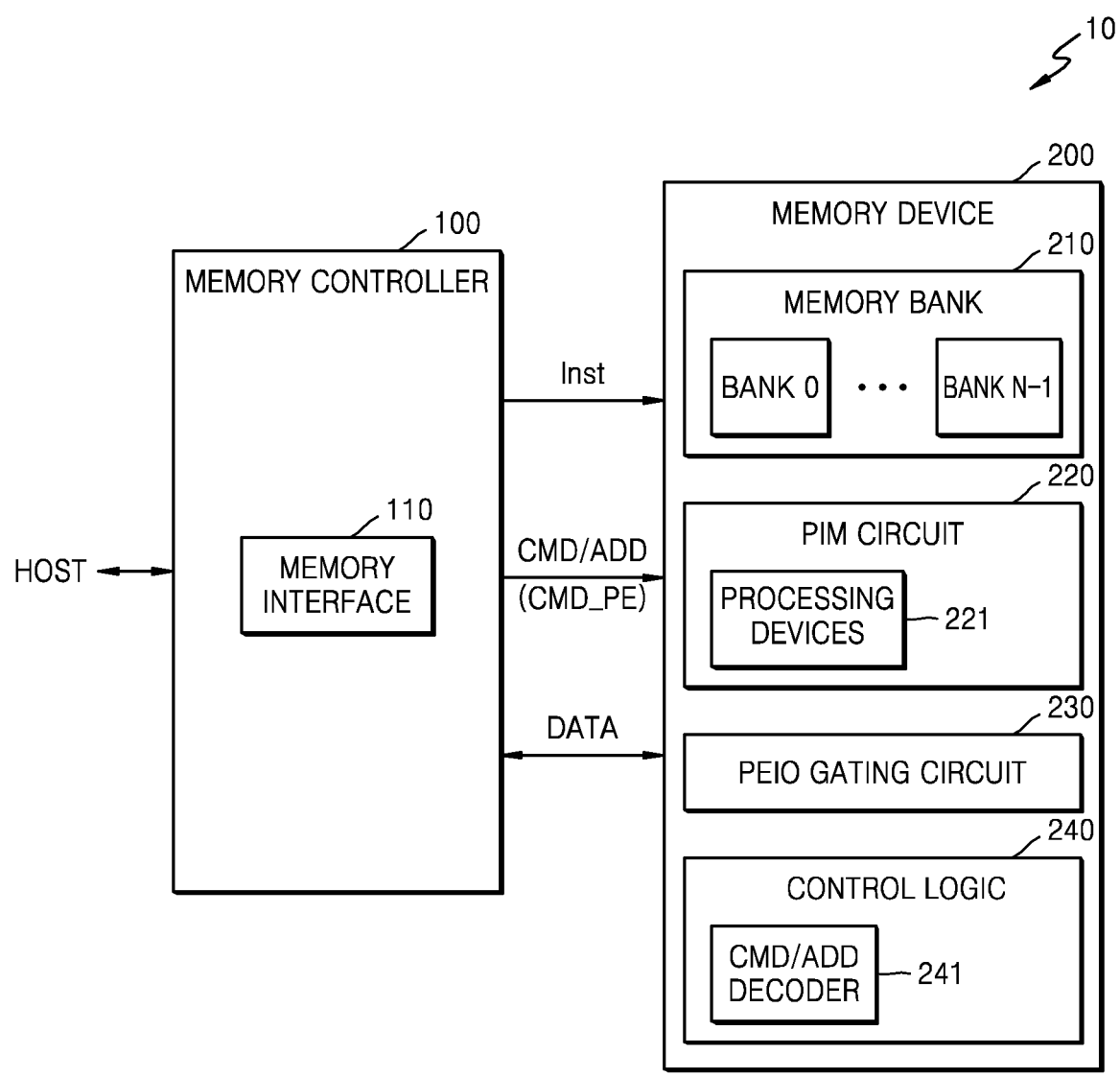
FIG. 1 is a block diagram illustrating a memory system including a memory device according to an exemplary embodiment of the inventive concept.

Hereinafter, exemplary embodiments of the inventive concept will be described in detail with reference to the accompanying drawings. Like reference numerals may refer to like elements throughout this application.

Exemplary embodiments of the inventive concept provide a memory device for processing an operation, where the memory device is capable of preventing data from colliding with each other by providing an optimal data transmitting path, and a method of operating the same.

FIG. 1 is a block diagram illustrating a memory system including a memory device according to an exemplary embodiment of the inventive concept.

Referring to FIG. 1, a memory system 10 may include a memory controller 100 and a memory device 200. The memory controller 100 may include a memory interface 110, may provide various signals to the memory device 200 through the memory interface 110, and may control a memory operation such as writing or reading. For example, the memory controller 100 may provide a command CMD and an address ADD to the memory device 200, and may access data DATA of the memory device 200.

The memory controller 100 may access the memory device 200 in accordance with a request from a host HOST and the memory interface 110 may provide an interface with the memory device 200. The memory controller 100 may communicate with the host HOST by using various protocols. For example, the memory controller 100 may communicate with the host HOST by using an interface protocol such as peripheral component interconnect—express (PCI-E), advanced technology attachment (ATA), serial ATA (SATA), parallel ATA (PATA), or serial attached small computer system interface (SCSI) (SAS). In addition, each of other various interface protocols such as universal serial bus (USB), multi-media card (MMC), enhanced small disk interface (ESDI), or integrated drive electronics (IDE) may be applied to a protocol between the host HOST and the memory controller 100.

According to exemplary embodiments of the inventive concept, the memory controller 100 may correspond to the host HOST or a component included in the host HOST. The host HOST and the memory device 200 may configure a data processing system. Therefore, the memory system 10 may correspond to the data processing system or may be defined by a component included in the data processing system.

The memory device 200 may include a memory bank 210, a processor in memory (PIM) circuit 220, a processing element input and output gating circuit (hereinafter, referred to as a PEIO gating circuit) 230, and a control logic 240. The control logic 240 may include a command/address decoder 241. In addition, the memory bank 210 may include a plurality of banks BANK 0 to BANK N-1, and each of the banks BANK 0 to BANK N-1 may include a cell array including a plurality of memory cells. A bank may be variously defined. For example, the bank may be defined as a component including memory cells or a component including one or more peripheral circuits together with the memory cells.

On the other hand, two or more banks may be classified as one bank group and banks included in the same bank group may transmit and receive the data DATA to and from the memory controller 100 through a common bank group input and output line (hereinafter, referred to as a bank group IO). In addition, as a local path for accessing the cell array, a bank local input and output line (hereinafter, referred to as a bank local IO) may be arranged to correspond to each of the banks BANK 0 to BANK N-1.

From the memory controller 100, by the address ADD, a bank in which data access is to be performed may be selected. In addition, memory cells in the bank may be selected. In addition, the command/address decoder 241 may perform a decoding operation on the command/address CMD/ADD from the memory controller 100, and the control logic 240 may perform an internal control operation on the memory device 200 so that a memory operation is performed in accordance with a decoding result.

On the other hand, the memory device 200 may be dynamic random access memory (DRAM) such as double data rate synchronous dynamic random access memory (DDR SDRAM), low power double data rate (LPDDR) SDRAM, graphics double data rate (GDDR) SDRAM, or Rambus DRAM (RDRAM). However, the inventive concept is not limited thereto. For example, the memory device 200 may be implemented by non-volatile memory such as flash memory, magnetic RAM (MRAM), ferroelectric RAM (Fe-RAM), phase change RAM (PRAM), or resistive RAM (ReRAM).

In addition, the memory device 200 may correspond to a semiconductor chip or a channel in a memory device including a plurality of channels having independent interfaces. Alternatively, the memory device 200 may correspond to a memory module. Alternatively, the memory module may include a plurality of memory chips and the memory device 200 of FIG. 1 may correspond to a memory chip mounted on a module board.

Hereinafter, according to exemplary embodiments of the inventive concept, an example in which the PIM circuit 220 of the memory device 200 processes operations is described. Various kinds of operation processing operations may be performed in the memory device 200. For example, in relation to artificial intelligence (AI), at least parts of neural network operations may be performed in the memory device 200. For example, the host HOST may control the memory device 200 through the memory controller 100 so that at least parts of the neural network operations may be performed by the memory device 200. In addition, in the following exemplary embodiment of the inventive concept, it will be described that the memory controller 100 controls the memory device 200. However, the inventive concept is not limited thereto. For example, it may be described that the memory controller 100 corresponds to a component included in the host HOST and the host HOST controls the memory device 200.

The memory controller 100 may transmit one or more instructions Inst to the memory device 200 to process various operations. For example, the memory device 200 may receive a plurality of instructions Inst and may store the received instructions Inst in an instruction loading mode. In FIG. 1, transmission of the instructions Inst and the data DATA is separately illustrated. However, in an exemplary embodiment of the inventive concept, the instructions Inst and the data DATA may be transmitted and received in various forms. For example, the instructions Inst may be transmitted through a separate line that is not related to the data DATA or a line (a data line) for transmitting the data DATA.

As an implementation example, the PIM circuit 220 may include one or more processing elements 221 and instruction memory for storing the instructions Inst. Then, when the command/address CMD/ADD that instructs operations to be processed are received from the memory controller 100, an operation corresponding to the instruction Inst read from the instruction memory may be performed. Since operations may be processed in the memory device 200 by the memory controller 100 providing the command/address CMD/ADD, the memory controller 100 may control the memory device 200 so that a normal memory operation does not collide with an operation processing operation.

On the other hand, the command/address CMD/ADD for instructing operations to be processed may be variously defined. For example, in addition to a command related to the memory operation such as data writing/reading, an operation command CMD_PE may be further defined. The memory device 200 may selectively perform the memory operation or the operation processing operation based on a decoding operation for the command/address CMD/ADD. In addition, based on the address ADD, a position of data to be used for processing an operation or a position in which an operation result is to be stored may be determined.

On the other hand, the processing elements 221 may include various numbers of processing elements. For example, each of the processing elements may be arranged to correspond to one bank. Alternatively, each of the processing elements may be arranged to correspond to two or more banks. Each of the processing elements 221 may process operations by using at least one of the data DATA provided by the memory controller 100, the data DATA read from the memory bank 210, and information stored in a register included in a processing element.

The PEIO gating circuit 230 may control a transmitting path of information such as data. For example, the PEIO gating circuit 230 may be arranged to correspond to each of the banks BANK 0 to BANK N–1. When a plurality of data lines are arranged to correspond to each of the banks BANK 0 to BANK N–1, the PEIO gating circuit 230 includes a plurality of switches and the transmitting path of the data may be controlled in accordance with switching states of the switches. During the memory operation of the memory device 200, by the PEIO gating circuit 230, the data DATA may be transmitted and received between the memory controller 100 and the banks BANK 0 to BANK N–1. On the other hand, when the memory device 200 processes operations, by the PEIO gating circuit 230, the data DATA may be transmitted and received between the memory controller 100 and the processing elements 221 and between the banks BANK 0 to BANK N–1 and the processing elements 221.

As an implementation example, the PEIO gating circuit 230 may be arranged between a bank local IO corresponding to each of the banks BANK 0 to BANK N–1 and a bank group IO corresponding to a bank group. Based on a switching operation of the PEIO gating circuit 230, as the bank local IO and the bank group IO are electrically connected to each other, a memory operation such as data writing and data reading for the banks BANK 0 to BANK N–1 may be performed.

On the other hand, the operation processing operation of each of the processing elements 221 will be described as follows with reference to one processing element (for example, a first processing element corresponding to a first bank BANK 0).

The first processing element may process an operation by using the data DATA from the memory controller 100. In this case, the data DATA transmitted through the bank group IO does not need to be provided to the bank local IO connected to the first bank BANK 0. In addition, the first processing element may process an operation by using the data DATA read from the first bank BANK 0. In this case, the data DATA does not need to be provided to the bank group IO. Furthermore, the first processing element may process operations by using the data DATA from the memory controller 100 and the data DATA read from the first bank BANK 0. In this case, the bank local IO and the bank group IO may be electrically isolated from each other. Therefore, in the operation processing operation, by the switching operation of the PEIO gating circuit 230, operations may be processed in a state in which electric connection between the bank group IO and the bank local IO is blocked.

According to an exemplary embodiment of the inventive concept, in the memory device 200 having a structure of the bank group IO and the bank local IO, the transmitting path of the data DATA for the memory operation and the operation processing operation may be optimally set. In addition, when the PIM circuit 220 processes operations by using various data items DATA, it is possible to prevent the various data items DATA from colliding with one another. In addition, according to an exemplary embodiment of the inventive concept, since the memory device 200 does not process operations and operations are processed by a request from the memory controller 100, the memory controller 100 or the host HOST including the memory controller 100 may control operation processing timing of the memory device 200 and it is possible to prevent performance from deteriorating due to collision between the memory operation and the operation processing operation.

On the other hand, the PIM circuit 220 according to exemplary embodiments of the inventive concept may be variously defined and accordingly, the PIM circuit 220 may include various components. For example, the PIM circuit 220 may include other various components related to the operation processing together with the above-described processing elements 221. For example, various components such as a controller for controlling an overall operation of processing operations, instruction memory (or an instruction queue) for storing the instructions Inst, and instruction decoding circuits may be included in the PIM circuit 220.

On the other hand, operands transmitted to the processing elements 221 may include various kinds of information items such as the data DATA, weight value information, or a constant. In the following exemplary embodiments of the inventive concept, the terms may be mixedly used. However, the inventive concept is not limited to the above terms.

Figure 2:
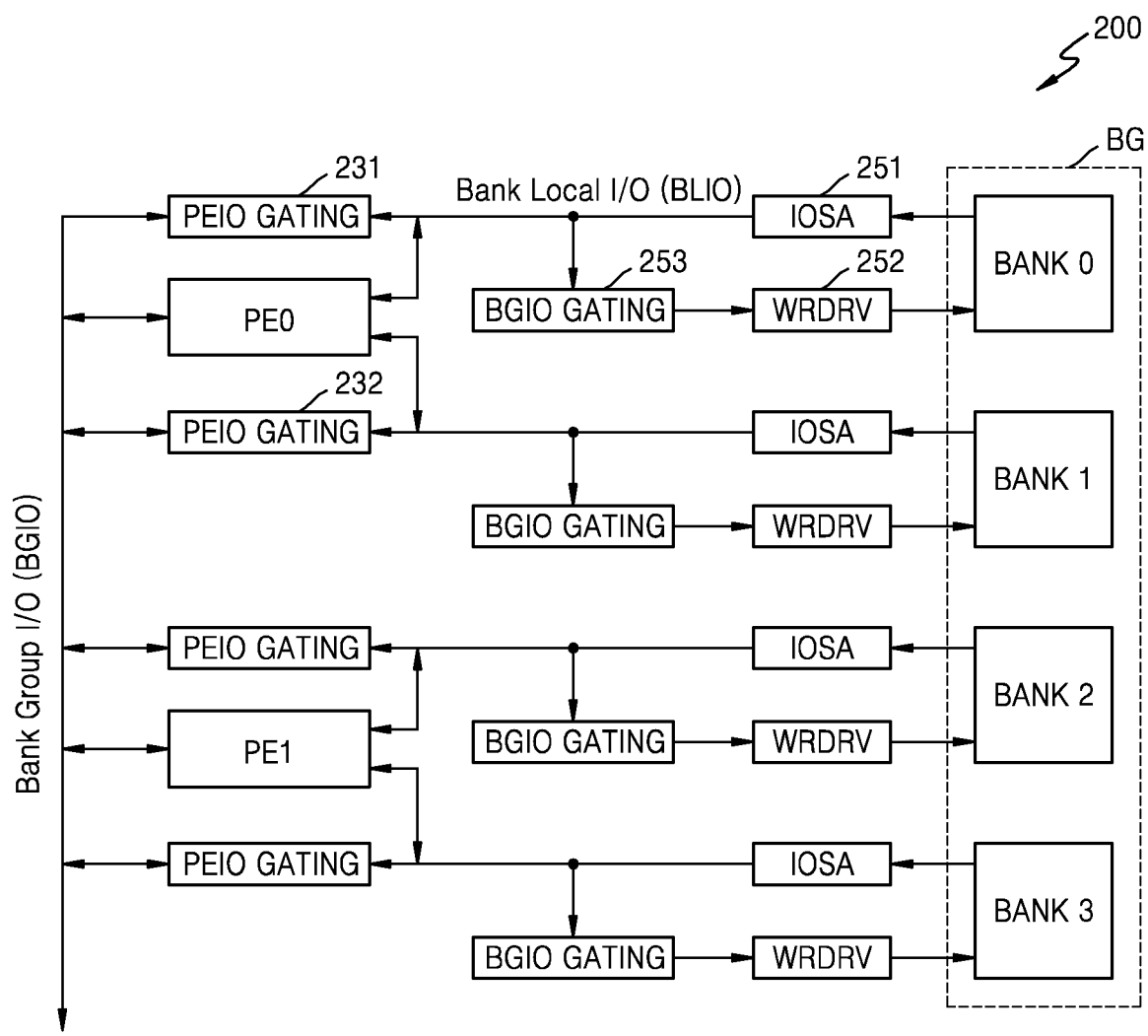
FIG. 2 is a block diagram illustrating the memory device of FIG. 1 according to an exemplary embodiment of the inventive concept.

FIG. 2 is a block diagram illustrating the memory device of FIG. 1 according to an exemplary embodiment of the inventive concept. A configuration and operation of the memory device 200 of FIG. 2 are described taking the first bank BANK 0 and a second bank BANK 1 as an example. In FIG. 2, first to fourth banks BANK 0 to BANK 3 are defined as one bank group BG, and accordingly, an example in which the first to fourth banks BANK 0 to BANK 3 share a bank group I/O (BGIO) is illustrated. The bank group I/O (BGIO) may bilaterally transmit data between the host HOST and the bank group BG.

Referring to FIGS. 1 and 2, the memory device 200 may further include various components related to the memory operation. For example, the memory device 200 may include a sense amplifier (IOSA) 251, a writing driver (WRDRV) 252, and a bank group input and output gating circuit (hereinafter, referred to as a BGIO gating circuit 253) to correspond to the first bank BANK 0. In addition, the sense amplifier 251 and the writing driver 252 may be arranged on a bank local I/O (BLIO), and the BGIO gating circuit 253 may be arranged to select a data transmitting direction of the bank local I/O (BLIO). In FIG. 2, an example, in which the BGIO gating circuit 253 is arranged in a path in which the data DATA is transmitted through the writing driver 252, is illustrated. However, the inventive concept is not limited thereto. For example, the memory device 200 may be implemented so that the BGIO gating circuit 253 is arranged in a path in which the data DATA is output through the sense amplifier 251.

On the other hand, the PEIO gating circuit 230 may include a first PEIO gating circuit 231 arranged to correspond to the first bank BANK 0 and a second PEIO gating circuit 232 arranged to correspond to the second bank BANK 1. The first and second PEIO gating circuits 231 and 232 may be arranged to control the movement path of the data DATA in the operation processing operation.

In the memory operation, the first PEIO gating circuit 231 electrically connects the bank local I/O (BLIO) and the bank group I/O (BGIO). Therefore, the data DATA from the first bank BANK 0 may be provided to the bank group I/O (BGIO) or the data DATA from the memory controller 100 may be provided to the first bank BANK 0 through the BGIO gating circuit 253. On the other hand, in the operation processing operation, the first PEIO gating circuit 231 electrically isolates the bank local I/O (BLIO) from the bank group I/O (BGIO). Therefore, the data DATA from the memory controller 100 may be provided to a first processing element PE0 without being provided to the bank local I/O (BLIO). In addition, the data DATA from the first bank BANK 0 may be provided to the first processing element PE0 without being provided to the bank group I/O (BGIO).

As illustrated in FIG. 2, the first processing element PE0 may be arranged to correspond to at least two banks. For example, the first processing element PE0 may be connected to the second bank BANK 1. When the first processing element PE0 processes operations by using the data DATA from the first bank BANK 0 and the second bank BANK 1, the second PEIO gating circuit 232 arranged to correspond to the second bank BANK 1 may block an electric connection between the bank group I/O (BGIO) and the bank local I/O (BLIO) corresponding to the second bank BANK 1.

In addition, in exemplary embodiments of the inventive concept, when the first processing element PE0 is shared by a plurality of banks, an operation processing result obtained by using the data DATA of one bank may be stored in another bank. For example, the data DATA read from the first bank BANK 0 is provided to the first processing element PE0 as an operand and the operation result from the first processing element PE0 may be stored in the second bank BANK 1.

Figure 3:
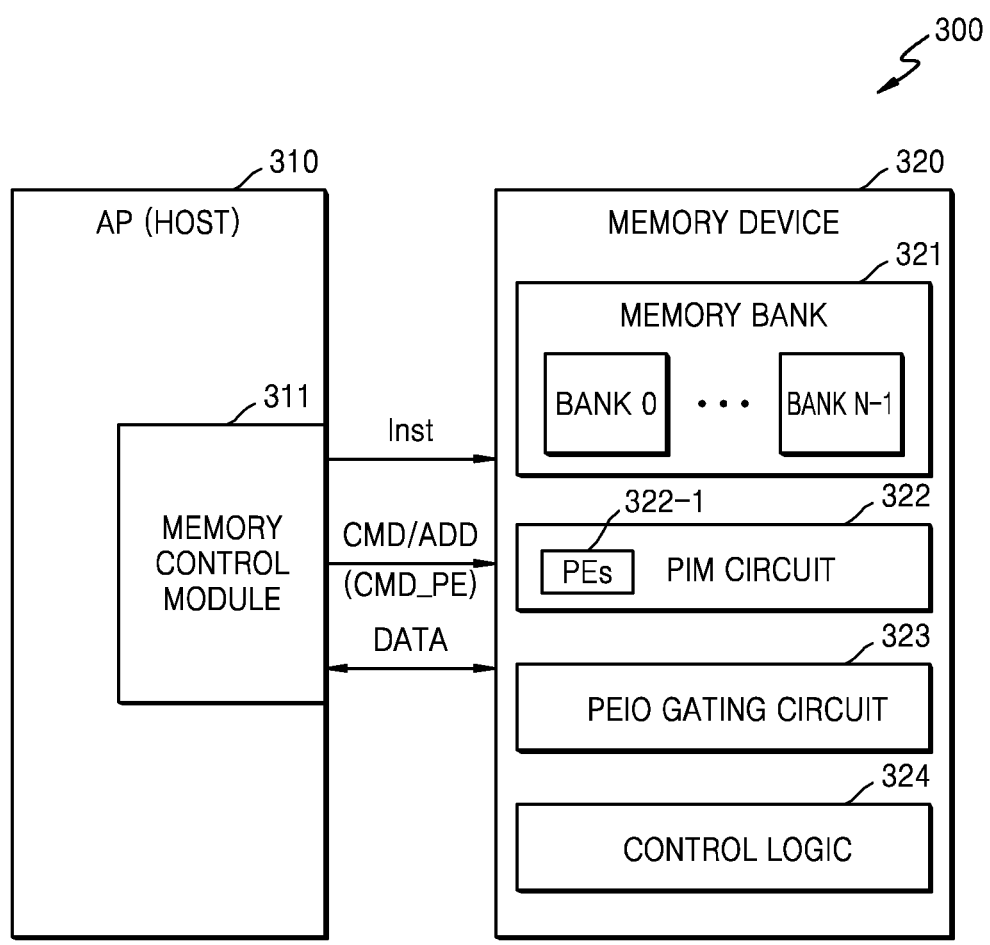
FIG. 3 is a block diagram illustrating a data processing system including a memory device according to an exemplary embodiment of the inventive concept.

FIG. 3 is a block diagram illustrating a data processing system including a memory device according to an exemplary embodiment of the inventive concept. As illustrated in FIG. 3, a data processing system 300 may include an application processor 310 and a memory device 320, and the application processor 310 may include a memory control module 311 that communicates with the memory device 320. For example, the memory control module 311 and the memory device 320 may configure a memory system. The application processor 310 may function as the host HOST of FIG. 1.

The application processor 310 may be implemented by a system on chip (SoC) including a system bus. As a standard specification of the system bus, the advanced microcontroller bus architecture (AMBA) protocol of advanced RISC machine (ARM) may be applied. A bus type of the AMBA protocol may be an advanced high-performance bus (AHB), an advanced peripheral bus (APB), an advanced extensible interface (AXI), AXI4, or AXI coherency extensions (ACE). Other than the above bus types, another type of protocol such as the uNetwork of SONICs Inc., the CoreConnect of IBM, or the open core protocol of OCP-IP may be applied.

The memory control module 311 may function as the memory controller in the above-described exemplary embodiment of the inventive concept, and may control the memory operation or the operation processing operation in the memory device 320 by transmitting the command/address CMD/ADD to the memory device 320. According to the above-described exemplary embodiments of the inventive concept, the data processing system 300 may include a memory bank 321, a PIM circuit 322, a PEIO gating circuit 323, and a control logic 324, the PIM circuit 322 may include processing elements 322_1, and the control logic 324 may include a command/address decoder. In addition, the application processor 310 may provide the plurality of instructions Inst to the memory device 320 to process operations in the memory device 320, and the plurality of instructions Inst may be stored in instruction memory in the memory device 320.

In addition, according to the above-described exemplary embodiment of the inventive concept, the application processor 310 may provide the operation command CMD_PE that instructs operations to be processed to the memory device 320. The control logic 324 may determine an operation processing mode based on a decoding result of the received command/address CMD/ADD, and a switching state of the PEIO gating circuit 323 may be controlled based on the operation processing mode. For example, in the operation processing operation, in accordance with the switching state of the PEIO gating circuit 323, electric connection between the bank local IO and the bank group IO may be blocked, and accordingly, it is possible to prevent the data DATA used for processing operations as operands from colliding with each other.

Figure 4:
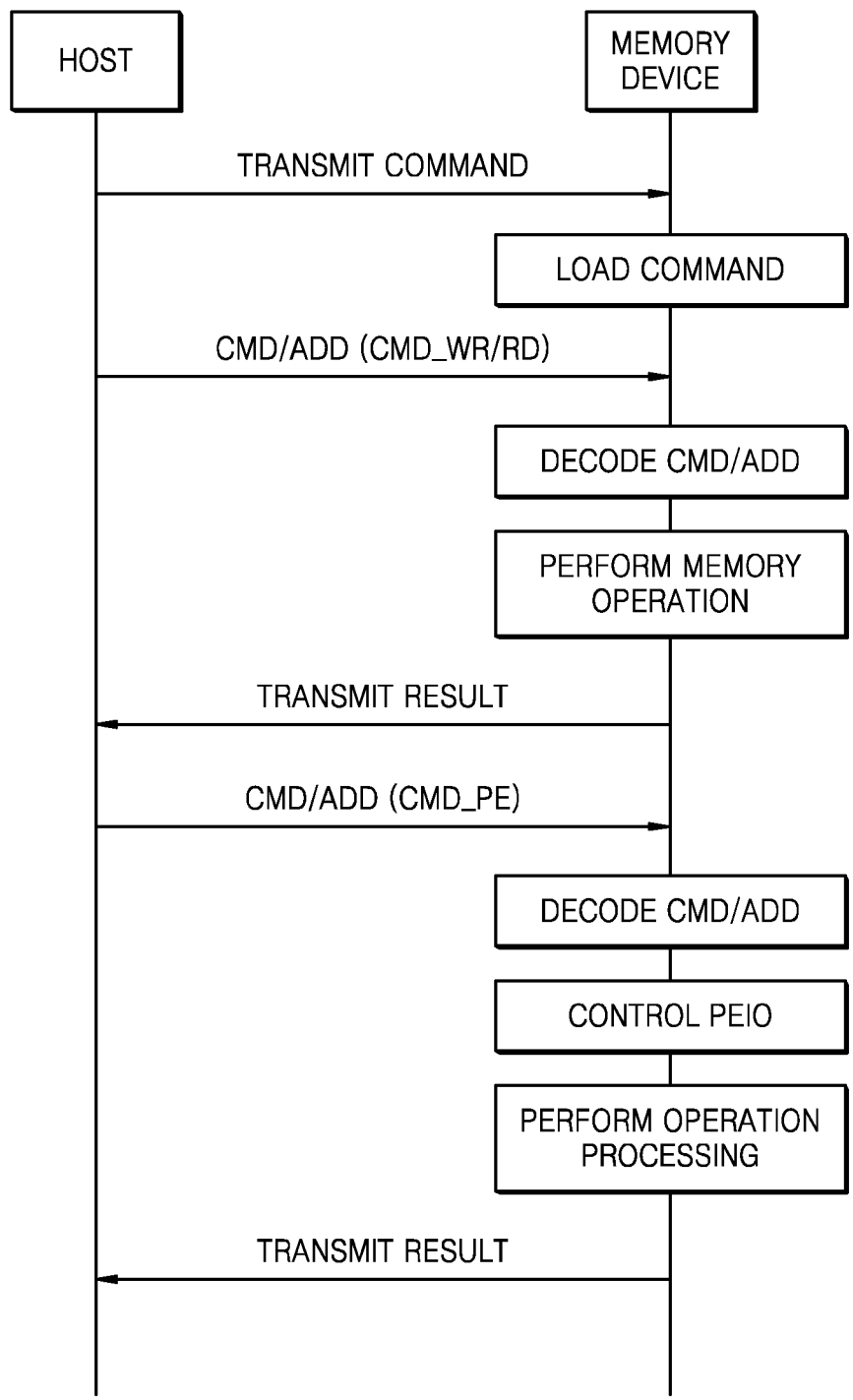
FIG. 4 is a conceptual diagram illustrating an operation of a memory system according to an exemplary embodiment of the inventive concept.

FIG. 4 is a conceptual diagram illustrating an operation of a memory system according to an exemplary embodiment of the inventive concept. In FIG. 4, an example in which a memory device communicates with the host HOST is illustrated, and in the host HOST, a memory controller (or a memory control module) that communicates with the memory device may be provided.

Referring to FIG. 4, the host HOST may control various operation modes of the memory device and, as the memory device operates in an instruction loading mode, the host HOST may transmit a plurality of instructions for processing operations to the memory device and the transmitted instructions may be loaded in the instruction memory in the memory device. For example, various kinds of operations such as addition, subtraction, and multiplication may be processed by the memory device and the PIM circuit may determine kinds of operations corresponding to instructions, by reading the instructions in the operation processing mode and decoding the read instructions.

The host HOST may perform a control operation so that the memory device operates in a normal mode. For example, the host HOST may transmit the command/address CMD/ADD for instructing the memory operation to the memory device. The memory device may decode the received command/address CMD/ADD, and when the command CMD instructs a memory operation such as a writing command CMD_WR or a reading command CMD_RD, may perform the corresponding memory operation. In addition, as the memory operation is completely processed, a memory operation result may be output to the host HOST.

On the other hand, the host HOST may transmit the command/address CMD/ADD for instructing operations to be processed to the memory device. As the operation command CMD_PE is provided to the memory device, based on a command/address CMD/ADD decoding operation, the memory device may process operations. For example, the memory device may process operations in a state in which electric connection between the bank local I/O (BLIO) and the bank group I/O (BGIO) is blocked, by controlling the PEIO gating circuit arranged to correspond to a selected bank in the operation processing mode. For example, a processing element in the PIM circuit may process operations by using at least one of data from the host HOST, data read from the selected bank, and information stored in the processing element, and an operation processing result may be transmitted to the host HOST. Alternatively, according to an exemplary embodiment of the inventive concept, the operation processing result may be stored in a register in the processing element or a cell array of a bank, and the host HOST may transmit a command/address for reading the operation processing result to the memory device.

Figure 5:
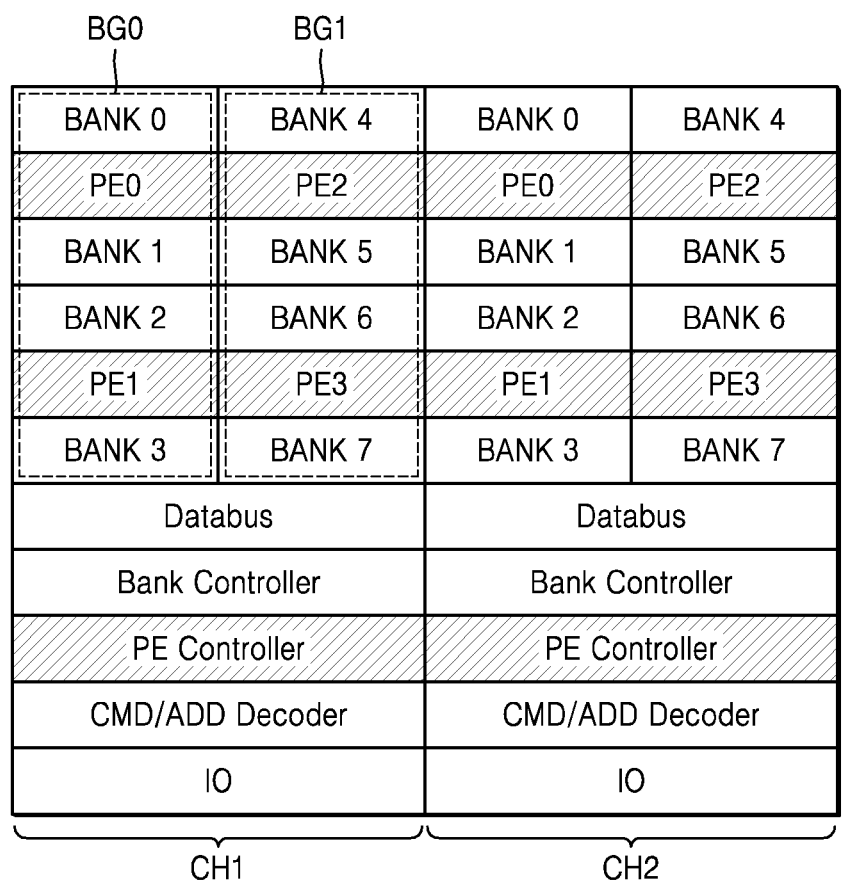
FIG. 5 is a block diagram illustrating various components included in a memory device according to an exemplary embodiment of the inventive concept.

FIG. 5 is a block diagram illustrating various components included in a memory device according to an exemplary embodiment of the inventive concept. In FIG. 5, an example in which the memory device includes a plurality of channels (for example, first and second channels CH1 and CH2) is illustrated. The first and second channels CH1 and CH2 may include separate input and output lines IO that communicate with an external host.

Taking the first channel CH1 as an example, the first channel CH1 may include a plurality of bank groups (for example, first and second groups BG0 and BG1), and each of the first and second bank groups BG0 and BG1 may include a plurality of banks. For example, the first bank group BG0 may include first to fourth banks BANK 0 to BANK 3. As one processing element is shared by two banks, first and second processing elements PE0 and PE1 may be arranged to correspond to the first bank group BG0. In addition, the bank group IO may be arranged to correspond to the first bank group BG1, and each of the first to fourth banks BANK 0 to BANK 3 may be connected to a corresponding bank local IO.

A data bus may include a path for transmitting data accessed by the first channel CH1. A bank controller may perform a bank control operation for accessing data of banks included in the first channel CH1. As an implementation example, one bank controller corresponding to one bank may be arranged. The bank controller may control an active operation and a pre-charge operation for rows included in the corresponding bank, and may also control a column selection operation for accessing data.

On the other hand, a processing element controller (hereinafter, referred to as a PE controller) may control processing elements PE0 to PE3. The PE controller may be arranged by various methods. For example, the PE controller may be arranged to correspond to a bank group or a channel. In addition, the command/address CMD/ADD decoder may decode the command/address from the host HOST, and the memory operation or the operation processing operation may be controlled based on a decoding result. For example, the PE controller may perform various control operations related to operation processing based on the decoding operation of the command/address CMD/ADD decoder.

The PE controller may control the operation processing operation of the processing element, and may control a transmitting path of data according to the above-described exemplary embodiments of the inventive concept. For example, one or more PEIO gating circuits may be arranged in the memory device, and the PE controller may generate control signals for controlling the switching operation of the one or more PEIO gating circuits.

On the other hand, a bank group may be variously defined. For example, in the above-described exemplary embodiment of the inventive concept, the bank group is illustrated as including the cell array of the plurality of banks. However, the bank group may be defined as further including components related to the memory operation and the operation processing operation together with the above-described cell array. For example, one or more processing elements PE and the PEIO gating circuit may be defined as being included in the bank group.

Figure 6:
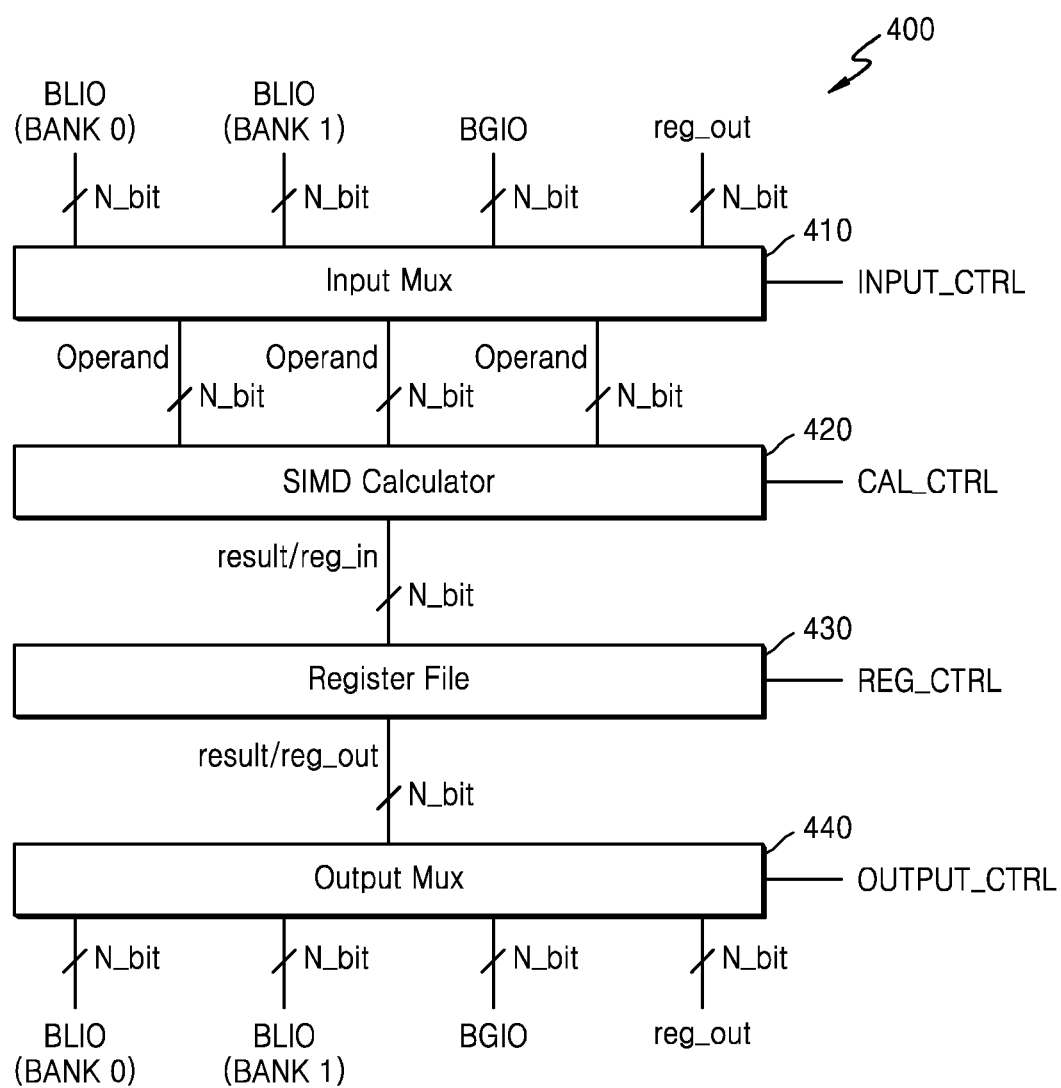
FIGS. 6 and 7 are block diagrams illustrating components included in a memory device in relation to operation processing according to an exemplary embodiment of the inventive concept.
Figure 7:
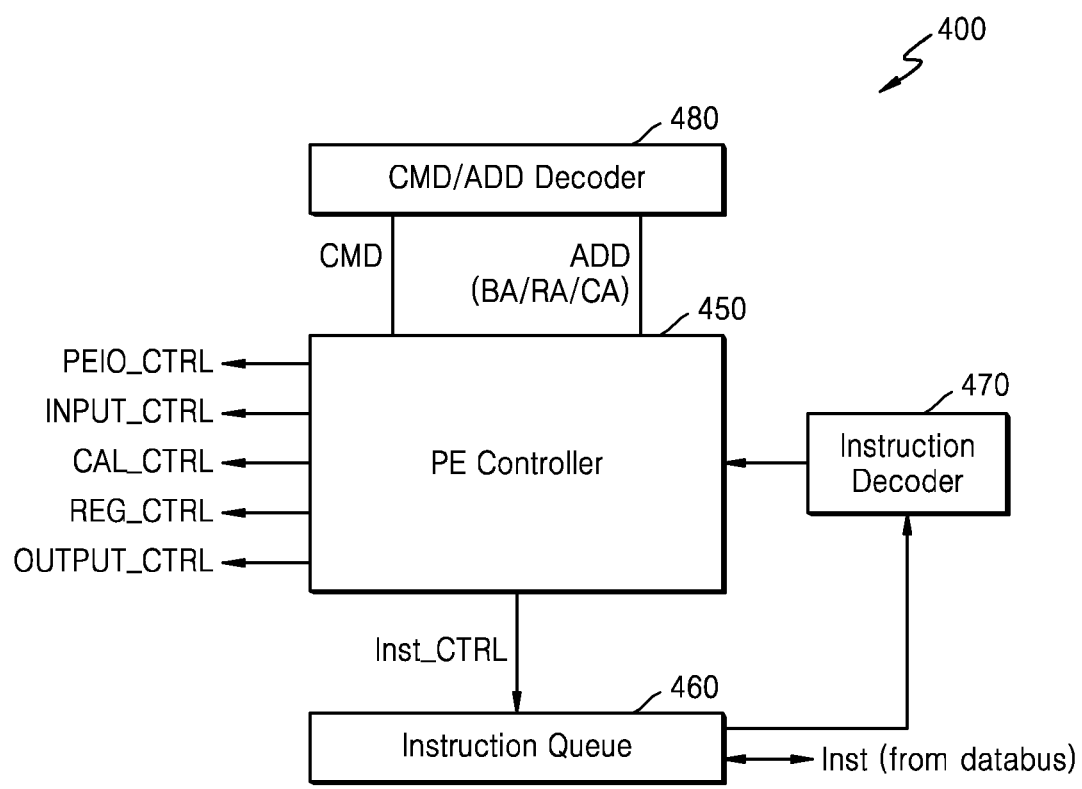

FIGS. 6 and 7 are block diagrams illustrating components included in a memory device in relation to operation processing according to an exemplary embodiment of the inventive concept.

Referring to FIGS. 5 to 7, a memory device 400 may include a plurality of processing elements. The processing element (for example, the first processing element PE0) illustrated in FIG. 6 may include an input selector 410, an operator 420, a register file 430, and an output selector 440. In FIG. 6, as an example of the operator 420, a single instruction multi data (SIMD) calculator is illustrated. However, the inventive concept is not limited thereto. Various kinds of operators may be applied to the first processing element PE0. In addition, an example in which various information items used for operations include N bits is illustrated. However, the number of bits may vary.

The register file 430 may store various information items related to operation processing. For example, in the register file 430, data including an operand used for an operation, an operation result, and previously set various information items (for example, a constant value for scaling) may be stored. For this purpose, the register file 430 may include one or more registers.

The input selector 410 may provide data items to be used for operations to the operator 420 in response to an input control signal INPUT_CTRL. Taking the first processing element PE0 for example, the input selector 410 may receive the data from the first bank BANK 0 and the data from the second bank BANK 1 through the bank local I/O (BLIO), may receive the data from the host HOST through the bank group I/O (BGIO), may receive the data (for example, a register output reg_out) stored in the register file 430, and may provide at least one data to the operator 420 in response to the input control signal INPUT_CTRL.

The operator 420 may perform an operation in response to an operation control signal CAL_CTRL and may provide an operation result as an input reg_in of the register file 430. The operation result may be stored in the register file 430, and the register file 430 may provide stored information (for example, the operation result) in response to a register control signal REG_CTRL to the output selector 440. In addition, the output selector 440 may output the operation result through various paths in response to an output control signal OUTPUT_CTRL. For example, the output selector 440 may provide the operation result to the first bank BANK 0 or the second bank BANK 1 through the bank local I/O (BLIO), may provide the operation result to the host HOST through the bank group I/O (BGIO), or may provide the operation result as an input of the input selector 410 for an operation.

On the other hand, FIG. 7 illustrates an implementation example of a PE controller 450 included in the memory device 400. As illustrated in FIG. 7, the memory device 400 may further include an instruction queue 460, an instruction decoder 470, and a command/address CMD/ADD decoder 480 together with the PE controller 450. Various components illustrated in FIGS. 6 and 7 may be included in the PIM circuit described in the above-described exemplary embodiment of the inventive concept. For example, the instruction queue 460 and the instruction decoder 470 may be included in the PIM circuit.

The PE controller 450 may perform various control operations related to operation processing based on the command/address CMD/ADD or a decoding result. The address ADD includes a bank address BA, a row address RA, and a column address CA. In addition, the PE controller 450 may generate the above-described various control signals INPUT_CTRL, CAL_CTRL, REG_CTRL, and OUTPUT_CTRL based on the decoded command/address CMD/ADD, and by controlling the switching state of the PEIO gating circuit in accordance with the above-described exemplary embodiments of the inventive concept, may output a PEIO control signal PEIO_CTRL for controlling electric connection between the bank local I/O (BLIO) and the bank group I/O (BGIO).

On the other hand, the operation processing may include various kinds of operations such as addition, subtraction, and multiplication, and a kind of an operation may be determined by decoding an instruction. The instruction queue 460 may receive a plurality of instructions Inst from the host HOST, and may store, for example, the instructions Inst received through a data bus. The PE controller 450 may control an operation of storing or reading the instructions Inst in or from the instruction queue 460 by providing the instruction control signal INST_CTRL to the instruction queue 460. In addition, the instructions Inst read from the instruction queue 460 may be provided to the instruction decoder 470 and the instruction decoder 470 may decode the instructions Inst.

Figure 8:
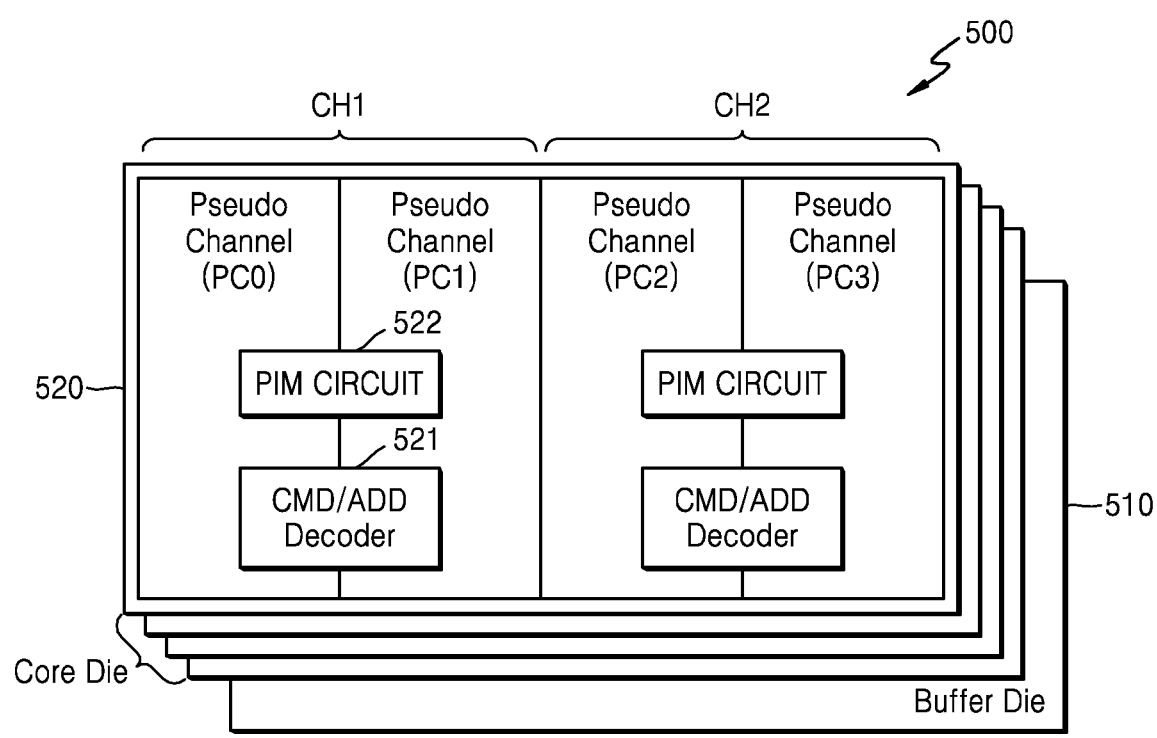
FIG. 8 is a block diagram illustrating an example in which a memory device according to an exemplary embodiment of the inventive concept includes high bandwidth memory (HBM).

FIG. 8 is a block diagram illustrating an example in which a memory device according to an exemplary embodiment of the inventive concept includes high bandwidth memory (HBM).

An HBM 500 includes a plurality of channels having independent interfaces and may have an increased bandwidth. Referring to FIG. 8, the HBM 500 may include a plurality of dies, for example, a buffer die (or a logic die 510) and one or more core dies stacked on the buffer die (or the logic die 510). In FIG. 8, an example in which four core dies are included in the HBM 500 is illustrated. However, the number of core dies may vary. A configuration of FIG. 8 will be described as follows with reference to a first core die 520 among the core dies.

The first core die 520 may include one or more channels. In FIG. 8, an example in which the first core die 520 includes two channels CH1 and CH2 is illustrated. The buffer die 510 may include an interface circuit that communicates with the host HOST (or the memory controller), and may receive the command/address CMD/ADD and the data from the host HOST through the buffer die 510. In addition, according to an exemplary embodiment of the inventive concept, the first and second channels CH1 and CH2 of the first core die 520 may each include the command/address decoder 521 and the PIM circuit 522. The PIM circuit 522 may control internal operation processing based on a result of decoding the command/address. In addition, various components related to the operation processing described in the above-described exemplary embodiments of the inventive concept may be included in the first and second channels CH1 and CH2. For example, each of the first and second channels CH1 and CH2 may include a bank group including a plurality of banks, the bank local I/O (BLIO), the bank group I/O (BGIO), and the PEIO gating circuit for controlling electric connection between the bank local I/O (BLIO) and the bank group I/O (BGIO).

In FIG. 8, an implementation example in which each of the first and second channels CH1 and CH2 of the HBM 500 includes at least two pseudo channels is illustrated. For example, the first channel CH1 of the first core die 520 may include two pseudo channels PC0 and PC1, data buses are separately implemented to correspond to the two pseudo channels PC0 and PC1, and the two pseudo channels PC0 and PC1 may share the command/address decoder 521. In addition, according to exemplary embodiments of the inventive concept, at least one of various components included in the PIM circuit 522 may be shared by the two pseudo channels PC0 and PC1. In other words, the two pseudo channels PC0 and PC1 may interface with the host HOST through separate data buses or a common command/address bus.

Figure 9:
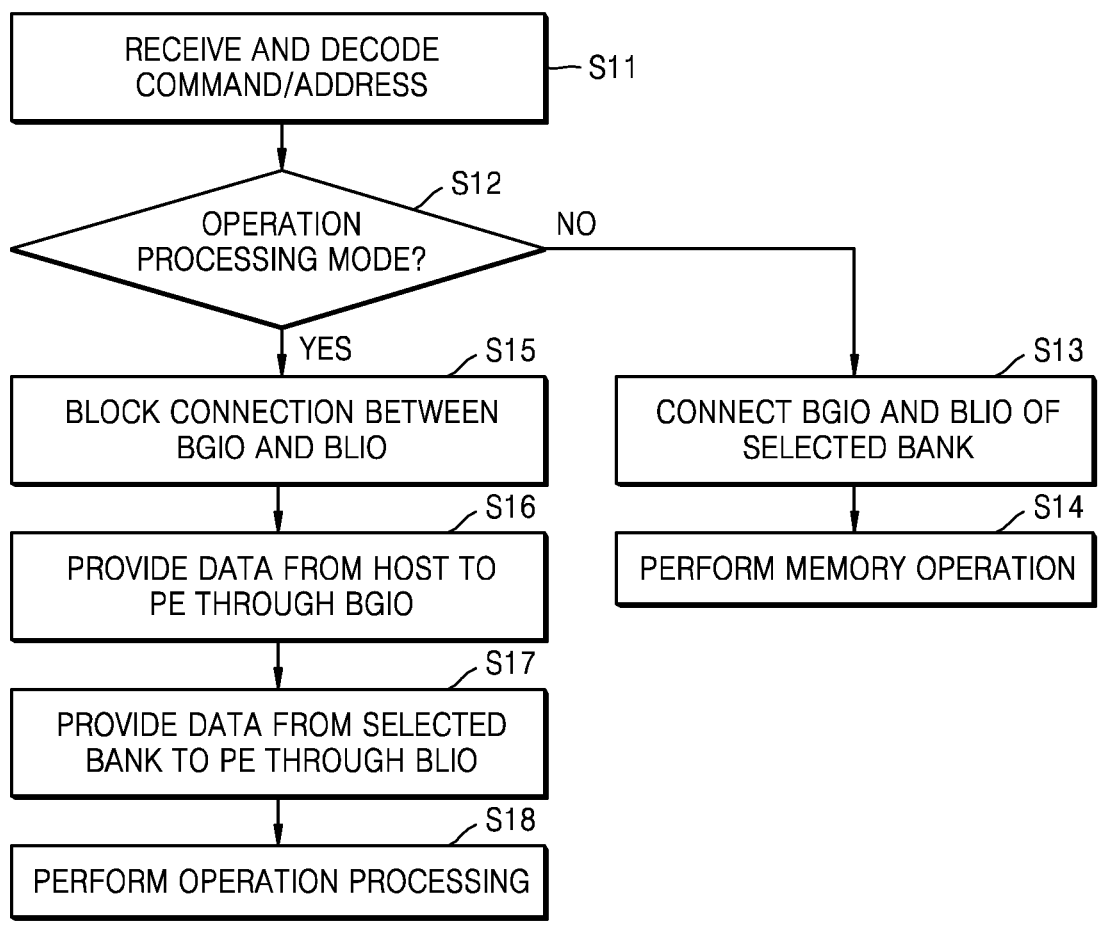
FIG. 9 is a flowchart illustrating a method of operating a memory device according to an exemplary embodiment of the inventive concept.

FIG. 9 is a flowchart illustrating a method of operating a memory device according to an exemplary embodiment of the inventive concept.

Referring to FIG. 9, the memory device may receive instructions provided by the host HOST, may store the received instructions, and may process operations in accordance with a request from the host HOST. The memory device may receive the command/address CMD/ADD from the host HOST, and may decode the received command/address CMD/ADD in operation S11. In addition, according to the decoding result, the memory device may operate in the operation processing mode. For example, according to the above-described exemplary embodiments of the inventive concept, a separate command for processing an operation is defined, or the operation processing mode may be selected based on values of a plurality of bits included in the command/address CMD/ADD.

It is determined whether the operation processing mode is selected based on the decoding result in operation S12. When it is determined that the operation processing mode is not selected (S12: NO), the bank local I/O (BLIO) and the bank group I/O (BGIO) of a bank selected for a normal memory operation are electrically connected to each other in operation S13. As the normal memory operation is performed, data may be provided to or read from the selected bank in operation S14.

On the other hand, when the operation processing mode is selected (S12:YES), for an operation processing operation, the bank local I/O (BLIO) and the bank group I/O (BGIO) are electrically isolated from each other in operation S15, and data and/or information for processing operations may be provided to a processing element PE. For example, data from the host HOST may be provided to the processing element PE through the bank group I/O (BGIO) in operation S16. In addition, the data read from the selected bank may be provided to the processing element PE through the bank local I/O (BLIO) in operation S17. The processing element PE may process operations by using the received data in operation S18.

On the other hand, the operations processed by the processing element PE according to the above-described exemplary embodiments of the inventive concept may include neural network operations, such as a deep learning algorithm. For example, the neural network operations may be executed by various kinds of hardware (or processors) such as general hardware such as a central processing unit (CPU) or a graphics processing unit (GPU), or dedicated hardware optimized for particular software. For example, the dedicated hardware may include various kinds of hardware such as an application specific integrated circuit (ASIC), a neural processing unit (NPU), a tensor processing unit (TPU), or a neural engine.

According to an exemplary embodiment of the inventive concept, at least partial operations of the neural network operations may be performed by the memory device according to exemplary embodiments of the inventive concept. The neural network operations may include an operation using data and a weight. The data and weight used for the operation may be provided from the host HOST or may be stored in the memory device. For example, when the data is provided by the host HOST and the weight is stored in the bank of the memory device, in the above-described exemplary embodiment of FIG. 9, the data may be provided to the processing element PE through the bank group I/O (BGIO), and the weight may be read from the selected bank and provided to the processing element PE through the bank local I/O (BLIO).

Figure 10A:
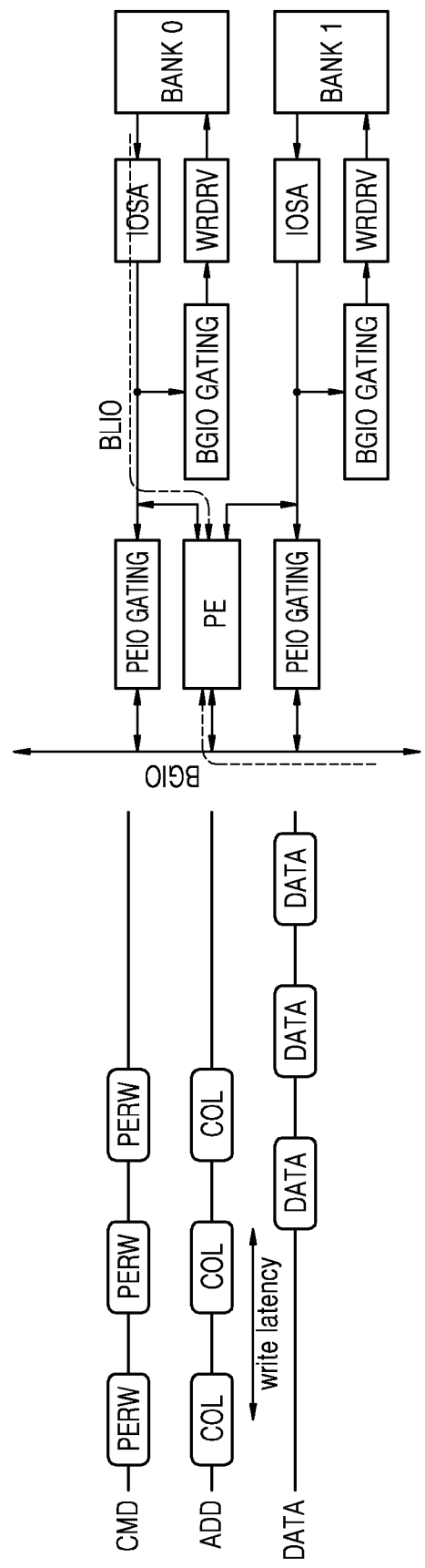
FIGS. 10A, 10B, and 10C illustrate operation commands defined by a memory device according to exemplary embodiments of the inventive concept.
Figure 10B:
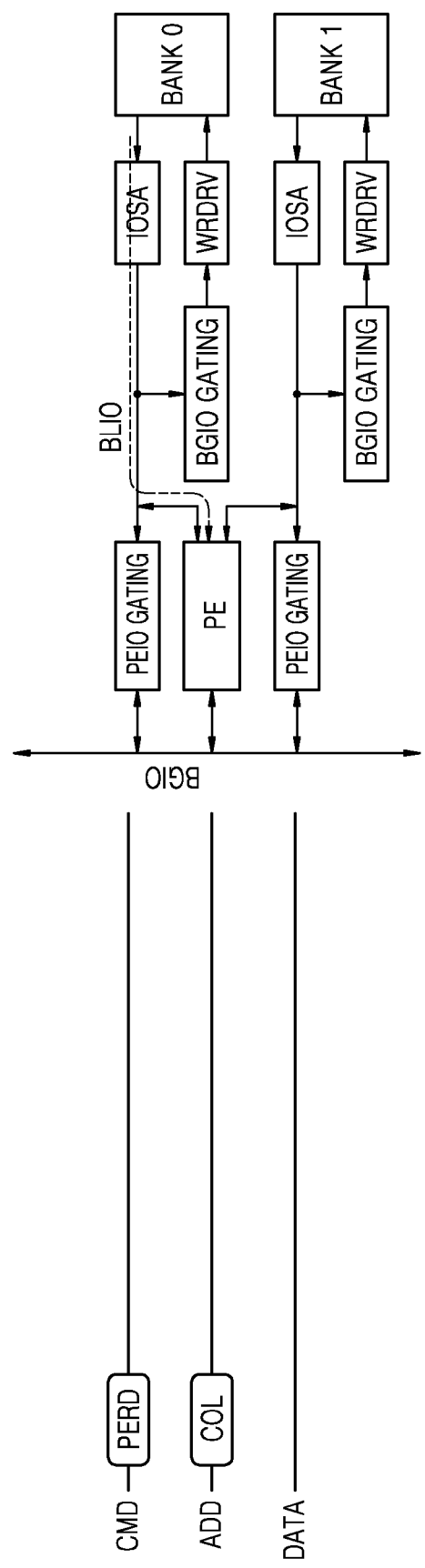
Figure 10C:
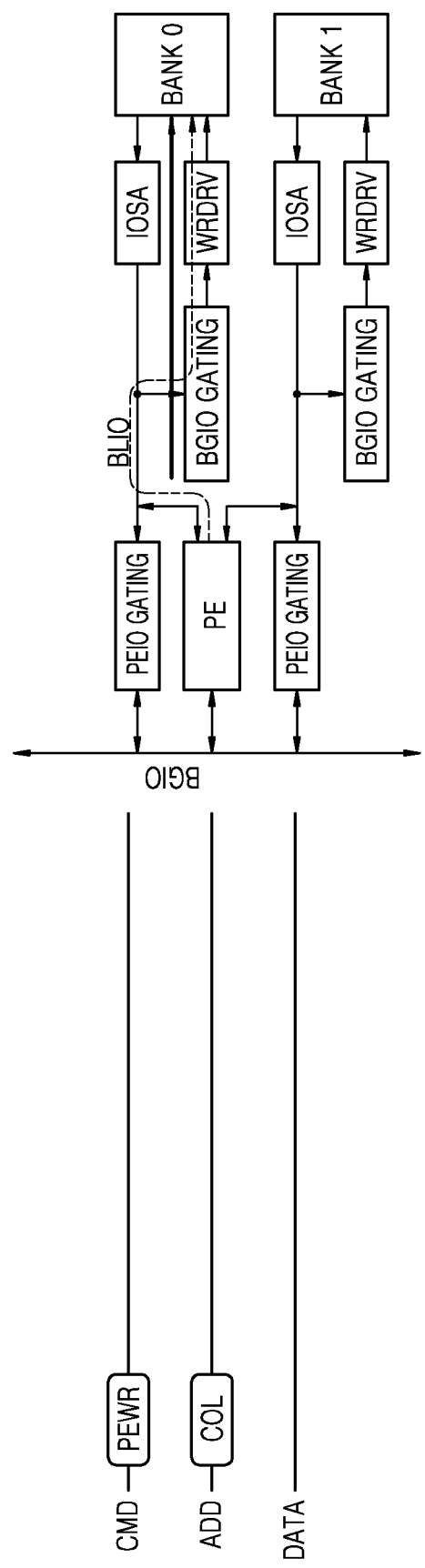

FIGS. 10A, 10B, and 10C illustrate operation commands defined by a memory device according to exemplary embodiments of the inventive concept.

According to exemplary embodiments of the inventive concept, as illustrated in FIGS. 10A, 10B, and 10C, in relation to operation processing, various operation commands PERW, PERD, and PEWR may be defined. When first to third operation commands PERW, PERD, and PEWR are received, the memory device may process operations by decoding instructions previously stored in the instruction memory. In addition, according to kinds of the first to third operation commands PERW, PERD, and PEWR, a transmitting path of data used for operations may vary. As an implementation example, based on a decoding result of the first to third operation commands PERW, PERD, and PEWR, the transmitting path of the data used for processing operations may be controlled to be different.

For example, referring to FIG. 10A, the first operation command PERW may be provided from the host HOST to the memory device, and in response to the first operation command PERW, an operation may be performed by using the data from the host HOST and the data in the memory device. One or more banks are selected and rows in the banks may be in an active state, and in accordance with column address information COL included in the address ADD, data items are read from the banks and may be provided to the processing element PE through the bank local I/O (BLIO). In addition, after prescribed latency, the data DATA is transmitted from the host HOST through the bank group I/O (BGIO) and may be provided to the processing element PE. The processing element PE may process operations by using the received data items.

On the other hand, referring to FIG. 10B, the second operation command PERD may be provided from the host HOST to the memory device, and in response to the second operation command PERD, an operation may be performed by using data in the memory device. For example, in accordance with the column address information COL, data is read from a bank and is provided to the processing element PE through the bank local I/O (BLIO), and the processing element PE may process an operation by using the data from the bank. As an operation example, the data read from the bank corresponds to the weight of the neural network operation, and when information (for example, a predetermined constant value) for scaling a value of the weight is stored in the register of the processing element PE, the processing element PE may operate based on the weight and the constant value.

On the other hand, referring to FIG. 10C, the third operation command PEWR may be provided from the host HOST to the memory device, and in response to the third operation command PEWR, information (for example, an operation result) stored in the register in the processing element PE may be recorded in a bank. For example, based on the decoding result of the command/address CMD/ADD, the information of the register in the processing element PE is read and the read information may be provided to a position corresponding to the column address information COL of the bank through the bank local I/O (BLIO).

In the above-described exemplary embodiments of FIGS. 10A, 10B, and 10C, only parts of operations that may be processed are mentioned. However, the memory device according to exemplary embodiments of the inventive concept may process various other kinds of operations. For example, various kinds of operations may be processed in accordance with an instruction read in response to the first to third operation commands PERW, PERD, and PEWR, and kinds of the operation commands PERW, PERD, and PEWR may be used for controlling the transmitting path of the data. For example, the host HOST may provide the third operation command PEWR and the data, and the processing element PE may process an operation by using the data provided by the host HOST in response to the third operation command PEWR.

On the other hand, the host HOST may sequentially provide instructions for processing a series of operations to the memory device. Therefore, kinds of operations to be processed at respective operation timings may be determined. Based on the kinds of operations processed at the respective operation timings, a command may be selected from the above-described operation commands PERW, PERD, and PEWR, and the selected command may be provided to the memory device.

Figure 11:
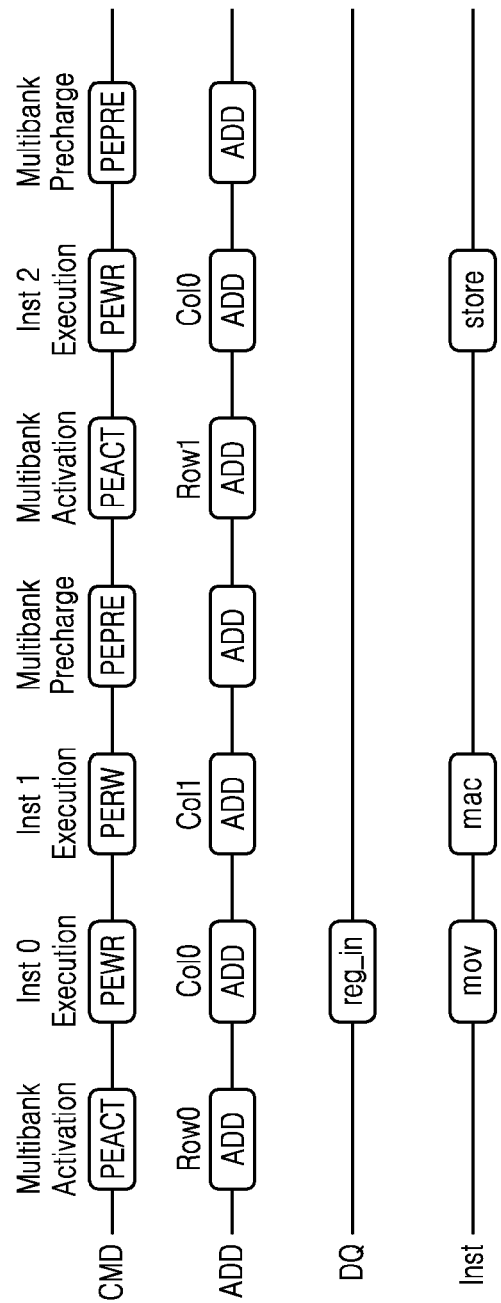
FIG. 11 is a waveform diagram illustrating operations serially processed by a memory device according to exemplary embodiments of the inventive concept.

FIG. 11 is a waveform diagram illustrating operations serially processed by a memory device according to exemplary embodiments of the inventive concept. In FIG. 11, an example in which rows of a plurality of banks are simultaneously selected and operations are processed in parallel by a plurality of processing elements is illustrated.

Referring to FIG. 11, an active command PEACT for activating a plurality of rows included in a plurality of banks may be defined. As the host HOST provides the active command PEACT to the memory device, a row (for example, a first row Row0) of each of the plurality of banks may be activated.

The host HOST may provide one or more operation commands to the memory device so that operations may be serially processed by the memory device. For example, the first to third operation commands PERW, PERD, and PEWR mentioned in the above-described exemplary embodiments of the inventive concept may be provided to the memory device. For example, the transmitting path of the data and/or information of the memory device may be controlled based on decoding results of the first to third operation commands PERW, PERD, and PEWR, and based on a decoding operation of an instruction (for example, a first instruction Inst 0) read from the instruction memory, a kind of a processed operation may be determined.

For example, the memory device may receive an address that represents a first column Col0 together with the third operation command PEWR, and in accordance with a decoding result mov of the first instruction Inst 0, may write data and/or information in a register in the processing element PE. For example, as rows of a plurality of banks are activated, a plurality of processing elements PE may process operations in parallel. For example, in response to the third operation command PEWR, data from a data bus may be provided to the plurality of processing elements PE in parallel as a register input reg_in.

In addition, the memory device may receive the first operation command PERW and an address that represents a second column Col1 from the host HOST, and may read and decode a second instruction Inst 1 in response to the first operation command PERW and the address. In accordance with a decoding result mac of the second instruction Inst 1, each of the plurality of processing elements PE may process information (for example, information provided by the host HOST and stored in the register) stored in the register and an operation (for example, multiplication and accumulation (MAC)) by using data read from the second column Col1 of a bank.

When the operations are completely processed in parallel by the plurality of processing elements PE, to pre-charge rows of banks, a pre-charge command PEPRE may be provided from the host HOST to the memory device. In addition, according to an operation example, operation processing results stored in the plurality of processing elements PE may be written in banks. For this purpose, the host HOST may provide a row (for example, a second row Row1) to the memory device together with the active command PEACT, and the memory device may receive the third operation command PEWR and the address (for example, the first column Col0). The memory device may read and decode a third instruction Inst 2 in response to the third operation command PEWR, and in accordance with a decoding result, operation processing results stored in the plurality of processing elements PE may be respectively stored in corresponding banks. Then, in accordance with the pre-charge command PEPRE from the host HOST, the rows of the banks of the memory device may be pre-charged.

FIGS. 12A, 12B, 13A, 13B, 14A, and 14B illustrate a memory device according to exemplary embodiments of the inventive concept.

Figure 12A:
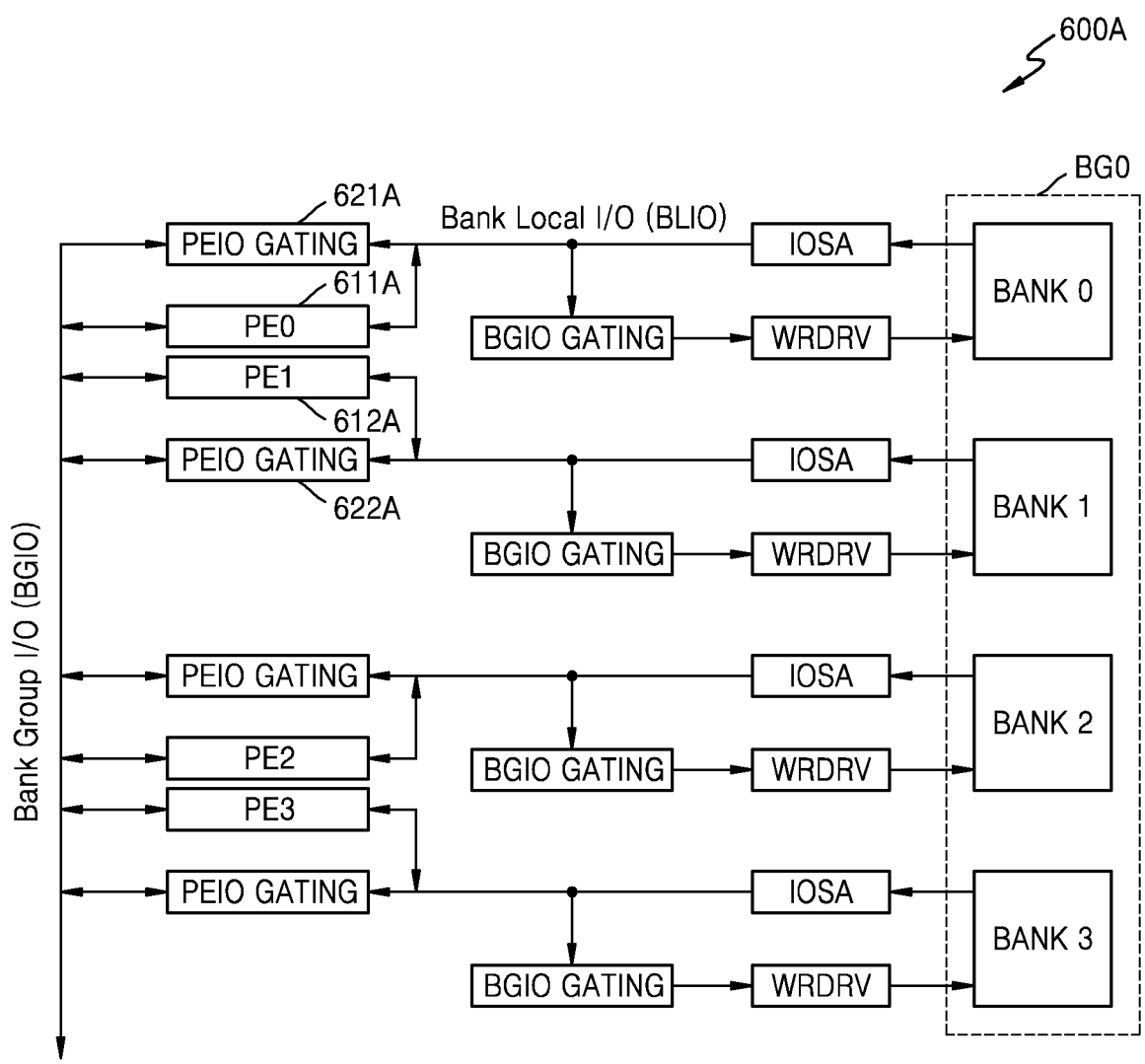
FIGS. 12A, 12B, 13A, 13B, 14A, and 14B illustrate a memory device according to exemplary embodiments of the inventive concept.
Figure 12B:
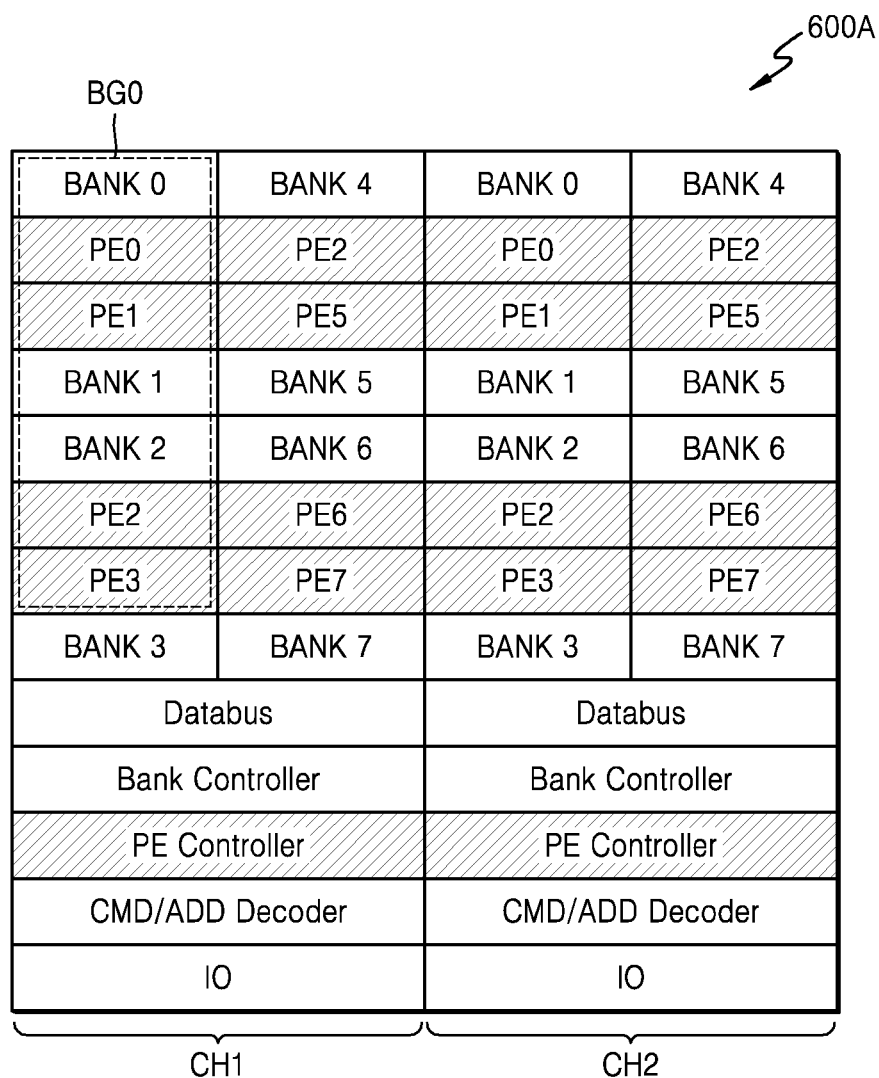

Referring to FIGS. 12A and 12B, a memory device 600A may include one or more bank groups. For example, the first bank group BG0 may include the first to fourth banks BANK 0 to BANK 3, and the processing elements may be arranged to correspond to the first to fourth banks BANK 0 to BANK 3. For example, in FIG. 12A, an example in which first and second processing elements 611A and 612A are arranged to correspond to the first and second banks BANK 0 and BANK 1 is illustrated. A first PEIO gating circuit 621A may be arranged to control connection between the bank group I/O (BGIO) and the bank local I/O (BLIO) of the first bank BANK 0. A second PEIO gating circuit 622A may be arranged to control connection between the bank group I/O (BGIO) and the bank local I/O (BLIO) of the second bank BANK 1.

On the other hand, referring to FIG. 12B, the memory device 600A may include a plurality of channels (for example, the first and second channels CH1 and CH2) and each of the first and second channels CH1 and CH2 may include one or more bank groups. For example, the components illustrated in FIG. 12A may be included in the first channel CH1 of the memory device 600A. In addition, like in the above-described exemplary embodiment of the inventive concept, various components for controlling the memory operation and the operation processing operation for each of the first and second channels CH1 and CH2 may be included in the memory device 600A. For example, in FIG. 12B, the data bus, the bank controller, the PE controller, and the command/address decoder are illustrated.

According to the exemplary embodiment illustrated in FIGS. 12A and 12B, operations may be processed in parallel by using data stored in the first to fourth banks BANK 0 to BANK 3. Taking neural network operations using weight value information stored in the first to fourth banks BANK 0 to BANK 3 as an example, the data from the host HOST is commonly provided to processing elements PE0 to PE3 illustrated in FIG. 12A and the processing elements PE0 to PE3 may process operations using weight values having different values in parallel by using the same data.

Figure 13A:
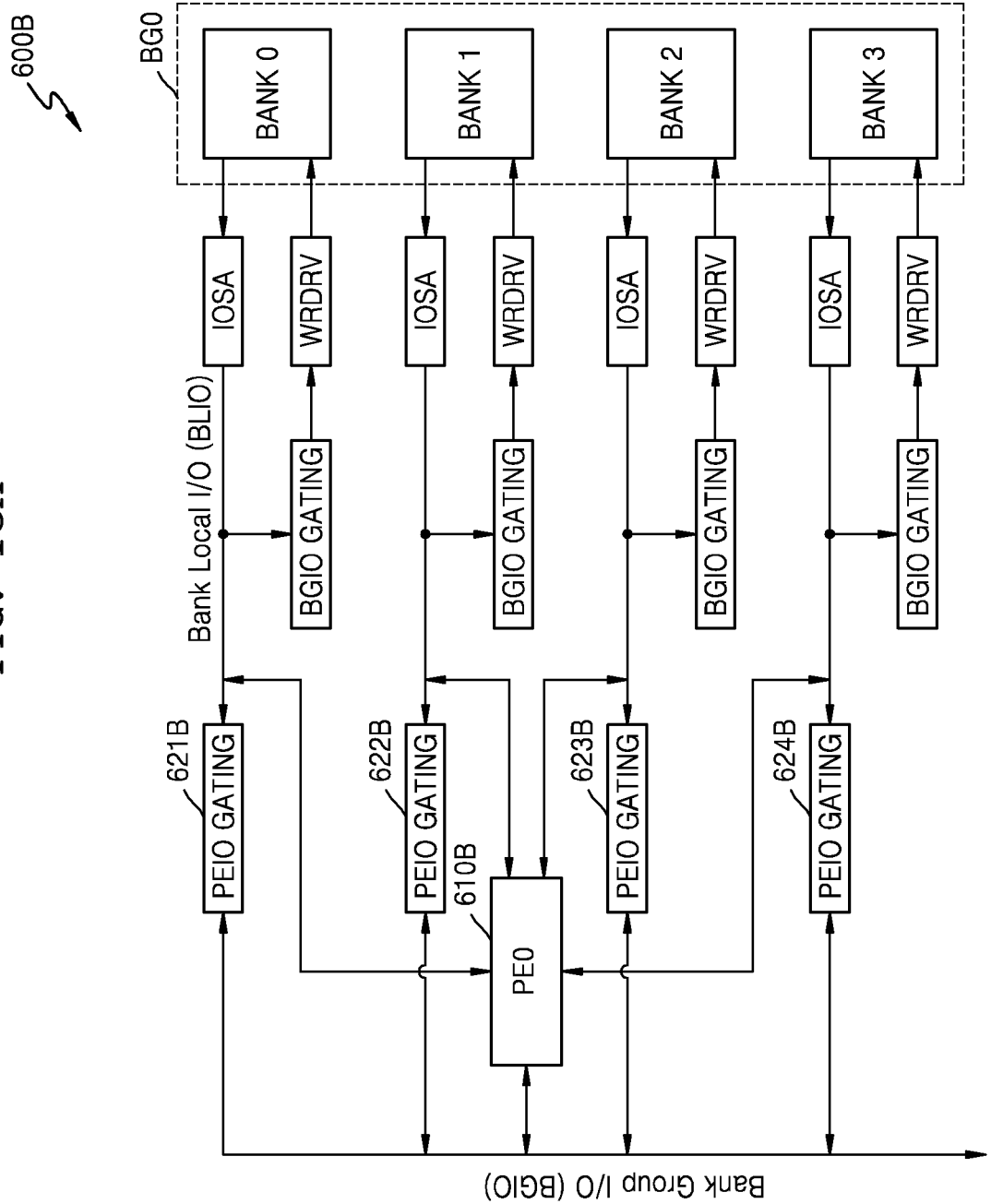
Figure 13B:
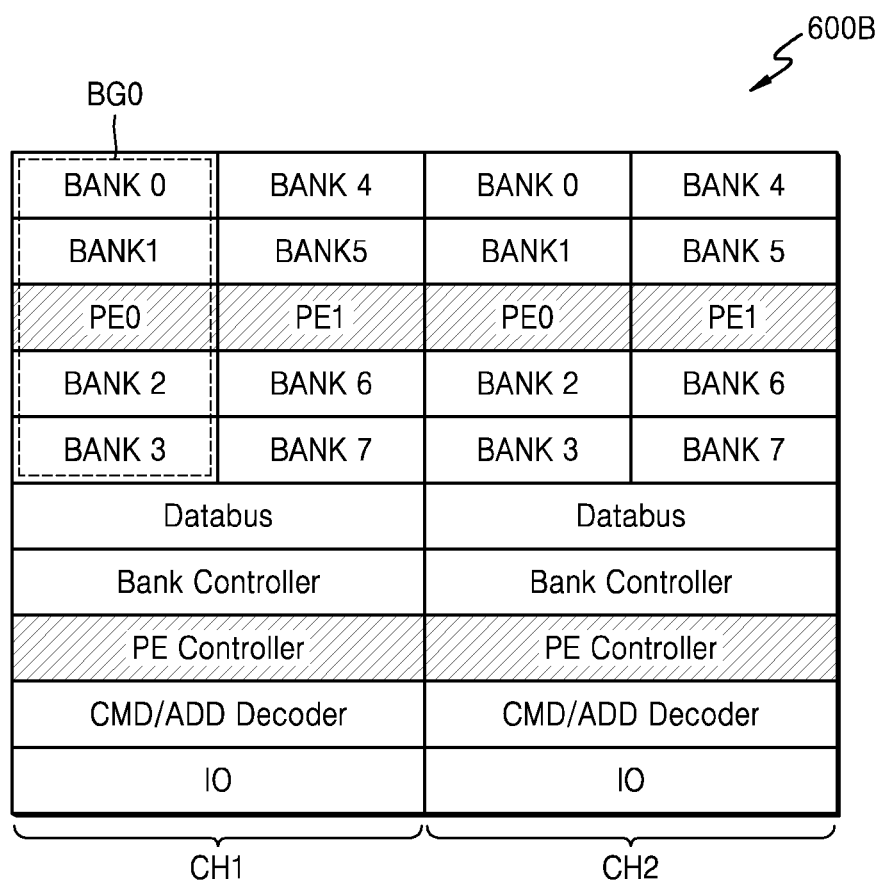

In FIGS. 13A and 13B, an example in which a memory device 600B includes one or more bank groups and one processing element 610B is arranged to correspond to one bank group (for example, the first bank group BG0) is illustrated. In addition, PEIO gating circuits 621B to 624B may be arranged to correspond to the first to fourth banks BANK 0 to BANK 3 of the first bank group BG0.

In accordance with the kinds of operations to be processed (or operands used for processing operations), data from at least one bank of the first to fourth banks BANK 0 to BANK 3 may be provided to the processing element 610B. In accordance with data and/or information used for processing operations, connection states of the PEIO gating circuits 621B to 624B may be controlled. In addition, in FIG. 13B, when the memory device 600B includes the same components as illustrated in FIG. 13A, an implementation example of the plurality of channels (for example, the first and second channels CH1 and CH2) included in the memory device 600B is illustrated.

Figure 14A:
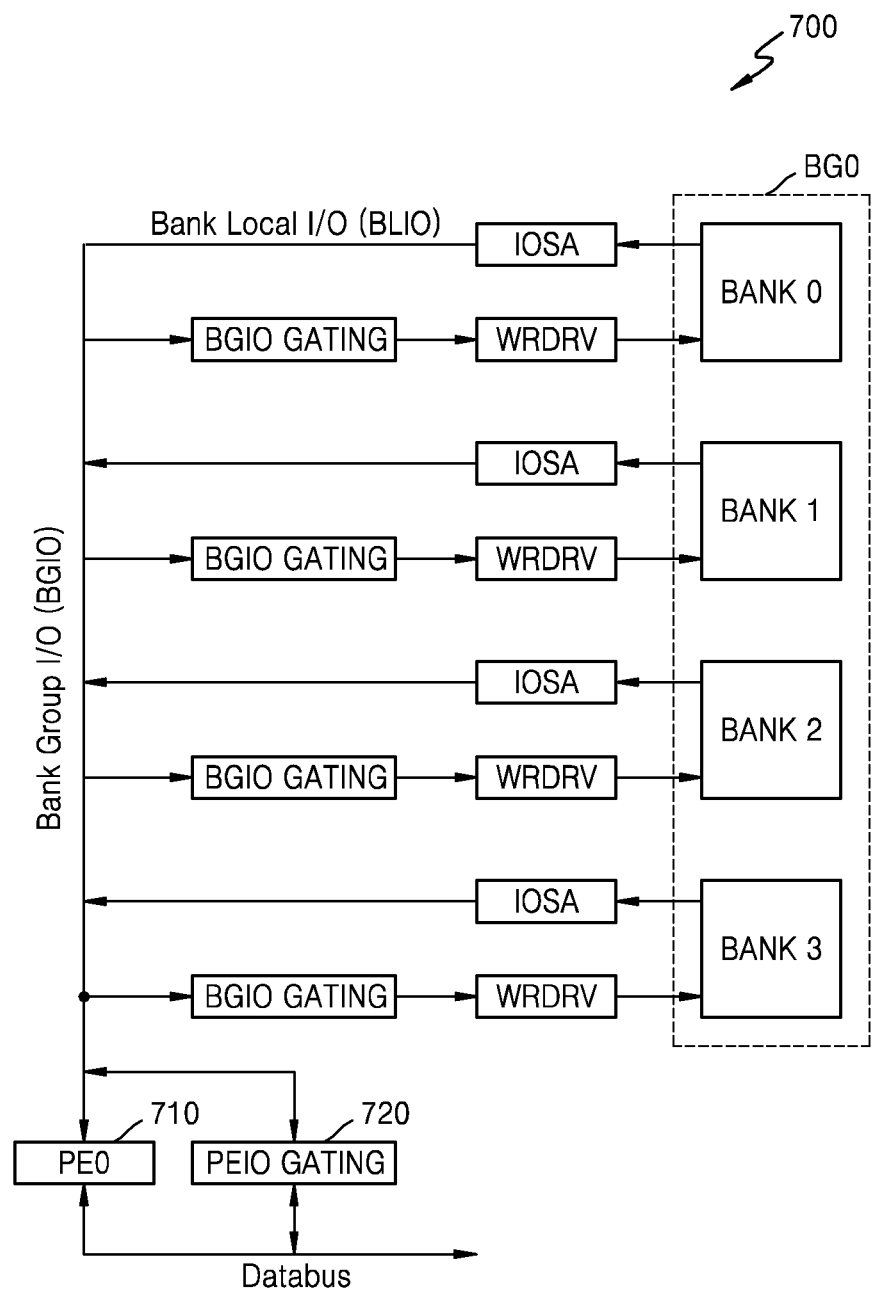

On the other hand, in FIG. 14A, a configuration example, in which one processing element is arranged to correspond to one bank group and the one processing element is arranged on the bank group I/O (BGIO), is illustrated.

Figure 14B:
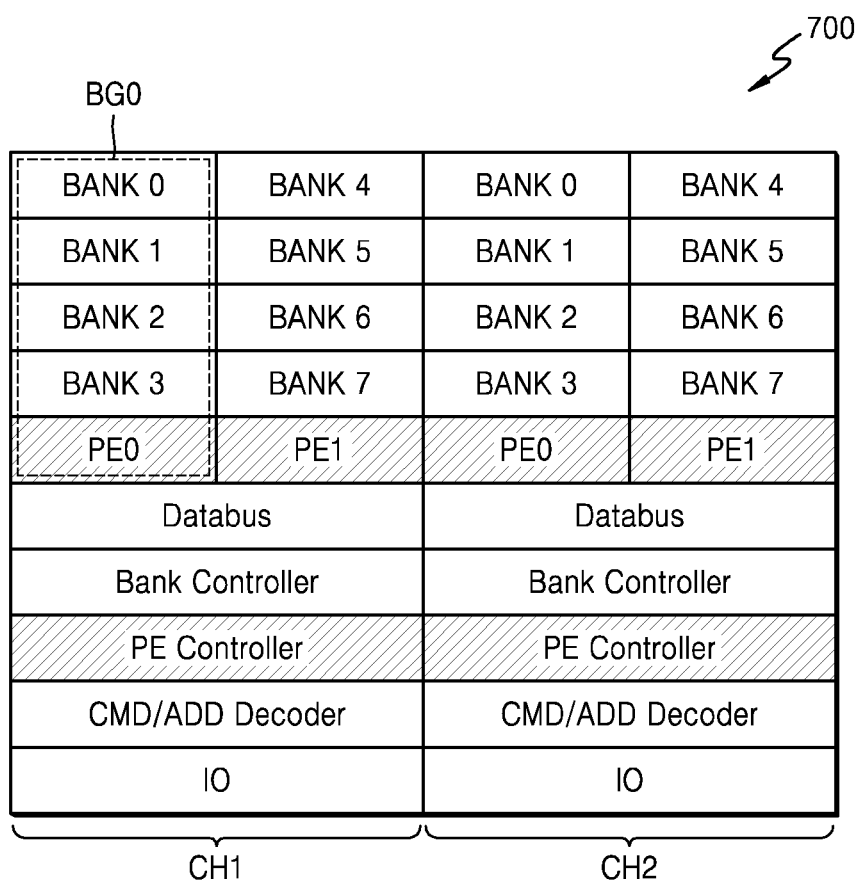

Referring to FIGS. 14A and 14B, a memory device 700 includes the first bank group BG0 including the first to fourth banks BANK 0 to BANK 3, and a processing element 710 arranged to correspond to the first bank group BG0 may receive data from the first to fourth banks BANK 0 to BANK 3 through the bank group I/O (BGIO) and may receive data from an external host through the data bus. In addition, the memory device 700 further includes a PEIO gating circuit 720 to correspond to the first bank group BG0 and the PEIO gating circuit 720 may control electric connection between the bank group I/O (BGIO) and the data bus.

As an operation example, when operations are processed, the PEIO gating circuit 720 may block electric connection between the bank group I/O (BGIO) and the data bus, and may prevent the data from the host HOST, which is provided to the processing element 710, from colliding with data through the bank group I/O (BGIO). On the other hand, in FIG. 14B, when the memory device 700 includes the same components as illustrated in FIG. 14A, an implementation example of the plurality of channels (for example, the first and second channels CH1 and CH2) included in the memory device 700 is illustrated. For example, unlike in the above-described exemplary embodiments of the inventive concept, the processing element 710 PE0 may be connected between the bank group I/O (BGIO) of the first bank group BG0 and the data bus.

Figure 15:
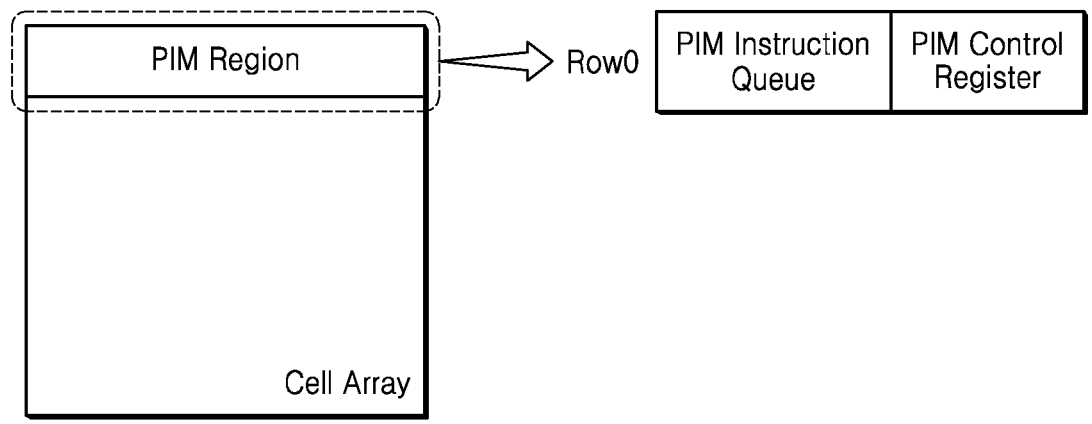
FIG. 15 illustrates a memory device according to an exemplary embodiment of the inventive concept.

FIG. 15 illustrates a memory device according to an exemplary embodiment of the inventive concept. In FIG. 15, an example of information stored in a cell array of one of a plurality of banks included in a bank group of a memory device is illustrated.

According to exemplary embodiments of the inventive concept, the memory device includes a PIM circuit, and may process an operation in response to a normal command from a memory controller (or the host HOST). For example, the normal command may include a writing command and a reading command that instruct a memory operation, and a partial region of the cell array may be used as a PIM region for storing control information for controlling the PIM circuit together with an instruction for processing an operation. In FIG. 15, an example, in which the instruction and control information are stored in a first row Row0 of the cell array, is illustrated. However, the inventive concept is not limited thereto, and the PIM region may be variously set.

According to an exemplary embodiment of the inventive concept, by instructing the PIM region of the cell array to perform a reading operation, the host HOST may perform a control operation so that the memory device processes an operation. The memory device may read information corresponding to the instruction in the above-described exemplary embodiment of the inventive concept and various control information items for processing operations, and may process the operations by using the above information items. For example, the memory device may determine kinds of operations (for example, movement of data and the MAC operation) based on the read instruction, and may control an active/pre-charge operation based on the read control information or may control the various paths according to the above-described exemplary embodiments of the inventive concept.

Figure 16:
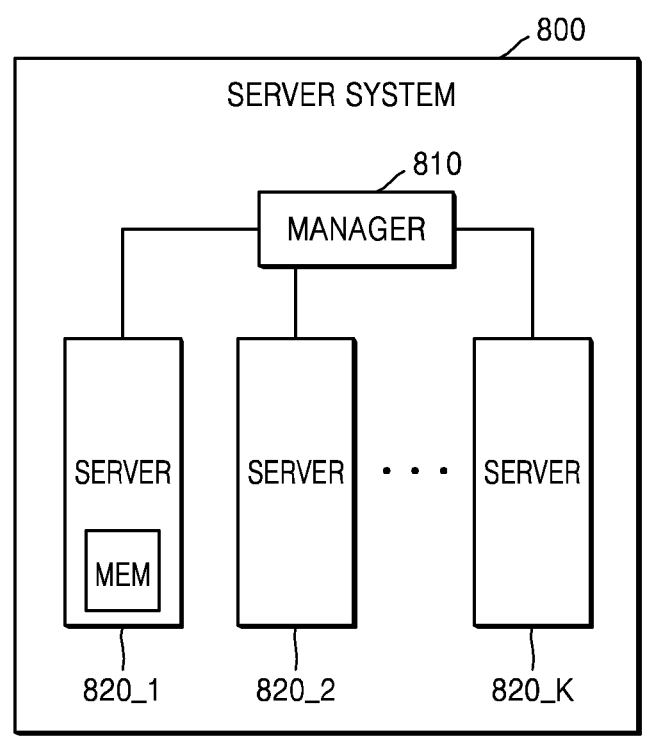
FIG. 16 is a block diagram illustrating a server system including a data processing system according to an exemplary embodiment of the inventive concept.

FIG. 16 is a block diagram illustrating a server system including a data processing system according to an exemplary embodiment of the inventive concept.

Referring to FIG. 16, a server system 800 may include a manager 810 and a plurality of servers 820_1 to 820_K. Each of the plurality of servers 820_1 to 820_K may correspond to the data processing system described in the above-described exemplary embodiments of the inventive concept. The plurality of servers 820_1 to 820_K are connected to one another through a bus that supports a prescribed protocol (for example, PCI or PCIe). For example, the plurality of servers 820_1 to 820_K may communicate with one another through a P2P connection structure based on control of the manager 810.

Referring to one server (for example, a first server 820_1), the first server 820_1 includes the host HOST according to the above-described exemplary embodiments of the inventive concept and one or more memory devices MEM, may process various kinds of operations in accordance with a function of the first server 820_1, and may store the processing result.

According to an exemplary embodiment of the inventive concept, each of the memory devices MEM may include a plurality of banks and processing elements arranged to correspond to the plurality of banks. By the host HOST providing an operation command, operation processing timing of the memory device MEM may be controlled. In addition, according to the above-described exemplary embodiments of the inventive concept, in the memory device MEM, in relation to a plurality of banks, the bank local I/O (BLIO) and the bank group I/O (BGIO) are arranged and the memory device MEM has a configuration in which electric connection between the bank local I/O (BLIO) and the bank group I/O (BGIO) is blocked in a process of processing operations. In exemplary embodiments of the inventive concept, the server system 800 corresponds to a neural network server system and the first server 820_1 may control the memory device MEM so that at least parts of a large amount of neural network operations may be processed by the memory device MEM.

While the inventive concept has been particularly shown and described with reference to exemplary embodiments thereof, it will be understood that various changes in form and details may be made thereto without departing from the spirit and scope of the inventive concept as set forth by the following claims.

What is claimed is:

1. A memory device comprising:
   a memory bank including a bank group including a plurality of banks;
   a processor in memory (PIM) circuit including a first processing element arranged to correspond to the bank group, wherein the first processing element is configured to process operations by using at least one of data provided by a host and data read from the bank group;
   a processing element input and output (PEIO) gating circuit configured to control electric connection between a bank local input and output line (bank local IO) arranged to correspond to each of the plurality of banks of the bank group and a bank group input and output line (bank group IO) arranged to correspond to the bank group; and
   a control logic configured to perform a control operation so that a memory operation for the memory bank is performed or operations are processed by the PIM circuit based on a decoding result for a command/address received from the host,
   wherein, when the operations are processed by the first processing element, the PEIO gating circuit blocks the electric connection between the bank local IO and the bank group IO,
   wherein the bank group comprises a first bank and a second bank,
   wherein the PEIO gating circuit comprises a first PEIO gating circuit arranged in a first bank local IO corresponding to the first bank and a second PEIO gating circuit arranged in a second bank local IO corresponding to the second bank, and
   wherein the first processing element processes the operations by receiving data from at least one of the first bank and the second bank.

2. The memory device of claim 1, wherein the first processing element processes the operations by using at least one of the data provided by the host, the data read from the bank group, and data stored in a register.

3. The memory device of claim 1, wherein,
   when the operations are processed by the first processing element, electric connection between the first and second bank local IOs and the bank group IO is blocked.

4. The memory device of claim 1, further comprising instruction memory configured to store at least one instruction provided by the host,
   wherein, when the command/address that instructs the operations to be processed are received from the host, the PIM circuit processes an operation corresponding to the at least one instruction read from the instruction memory.

5. The memory device of claim 4, wherein the PIM circuit comprises a processing element (PE) controller configured to generate control signals for controlling storage and reading of the at least one instruction and controlling the first processing element in relation to processing the operations.

6. The memory device of claim 5, wherein the first processing element comprises:
    an input selector configured to receive data transmitted through the bank local IO and data transmitted through the bank group IO, and to output data to be used for operations;
    an operator configured to process operations for one or more data provided from the input selector, and
    a register file configured to store an operation result by the operator.

7. The memory device of claim 6, wherein the first processing element further comprises an output selector configured to receive the operation result from the register file and to output the operation result to the bank local IO or the bank group IO.

8. The memory device of claim 1, wherein a plurality of operation commands for instructing the operations to be processed by the memory device are defined, and
    wherein, in accordance with a kind of operation command of the plurality of operation commands, a switching state of the PEIO gating circuit is controlled to vary.

9. The memory device of claim 1, wherein the PIM circuit further comprises second to Mth processing elements (where M is an integer less than or equal to N and N is a natural number greater than two) to correspond to N banks of the bank group, and
    wherein the first to Mth processing elements are substantially simultaneously enabled, receive data transmitted from the host through the bank group IO, and process operations in parallel by using the data provided by the host.

10. The memory device of claim 1, wherein at least parts of a plurality of operations for processing a neural network are processed by the memory device, and
    wherein the PIM circuit processes operations by using the data provided by the host and data corresponding to weight information stored in the memory bank.

11. A memory device comprising:
    a memory bank including a bank group including first and second banks;
    a bank group input and output line (bank group IO) arranged to correspond to the bank group and including a data transmitting path between an external host and the bank group;
    a first bank local input and output line (bank local IO) arranged to correspond to the first bank and including a transmitting path of data provided to the first bank and data read from the first bank;
    a first processing element connected to the bank group IO and the first bank local IO and configured to process operations by using at least one of data provided from the host and the data read from the first bank; and
    a first processing element input and output (PEIO) gating circuit configured to control a data transmitting path so that the data provided from the host is provided to the first processing element without being provided to the memory bank when operations are processed by the first processing element,
    wherein the first PEIO gating circuit is arranged between the bank group IO and the first bank local IO, and
    wherein, when the operations are processed by the first processing element, the first PEIO gating circuit blocks connection between the bank group IO and the first bank local IO.

12. The memory device of claim 11, further comprising:
    a second bank local IO arranged to correspond to the second bank and including a transmitting path of data provided to the second bank and data read from the second bank; and
    a second PEIO gating circuit configured to control electric connection between the bank group IO and the second bank local IO,
    wherein the first processing element is further connected to the second bank local IO and processes operations by using the data read from the second bank.

13. The memory device of claim 12, wherein the first PEIO gating circuit is arranged between the bank group IO and the first bank local IO, and
    wherein, when the operations are processed by the first processing element, connection between the bank group IO and the first and second bank local IOs is blocked.

14. The memory device of claim 11, further comprising:
    instruction memory configured to store at least one instruction provided by the host;
    an instruction decoder configured to decode an instruction read from the instruction memory as a command/address for instructing the operations to be processed is received from the host; and
    a processing element controller configured to output a control signal to the first processing element so that operations are processed in accordance with a decoding result of the instruction read from the instruction memory.

15. A method of operating a memory device including a bank group including a plurality of banks, the method comprising:
    determining an operation processing mode of the memory device based on a decoding result of a command/address from a host;
    blocking electric connection between a bank local input and output line (bank local IO) corresponding to a selected bank among the plurality of banks and a bank group input and output line (bank group IO) arranged to correspond to the bank group, by a processing element input and output (PEIO) gating circuit connected to the bank local IO line and the bank group IO line, when the operation processing mode is determined;
    providing at least one of data provided by the host and data read from the selected bank to a processing element in a state in which electric connection between the bank local IO and the bank group IO is blocked; and
    processing operations by the processing element.

16. The method of claim 15, further comprising:
    electrically connecting the bank local IO to the bank group IO when it is determined that the operation processing mode is not determined; and
    performing a memory operation by transmitting data between the bank local IO and the bank group IO.

17. The method of claim 15, wherein,
    in the determining of the operation processing mode, in addition to a command related to a normal memory operation, it is determined whether a command that instructs operations to be processed is received.

* * * * *